US00RE47207E

(19) United States
(12) Reissued Patent
Liaw

(10) Patent Number: US RE47,207 E
(45) Date of Reissued Patent: Jan. 15, 2019

(54) CELL STRUCTURE FOR DUAL-PORT SRAM

(71) Applicant: Taiwan Semiconductor Manufacturing Company, Ltd., Hsin-Chu (TW)

(72) Inventor: Jhon Jhy Liaw, Hsinchu County (TW)

(73) Assignee: Taiwan Semiconductor Manufacturing Company, Ltd., Hsin-Chu (TW)

(21) Appl. No.: 15/074,710

(22) Filed: Mar. 18, 2016

Related U.S. Patent Documents

Reissue of:
(64) Patent No.: 8,675,397
Issued: Mar. 18, 2014
Appl. No.: 12/823,907
Filed: Jun. 25, 2010

(51) Int. Cl.

| | |
|---|---|
| ***G11C 11/00*** | (2006.01) |
| ***G11C 8/16*** | (2006.01) |
| ***H01L 27/11*** | (2006.01) |
| ***H01L 27/02*** | (2006.01) |
| *H01L 29/78* | (2006.01) |

(52) U.S. Cl.
CPC ..... *G11C 8/16* (2013.01); *H01L 27/0207* (2013.01); *H01L 27/11* (2013.01); *H01L 27/1104* (2013.01); *H01L 29/785* (2013.01)

(58) Field of Classification Search
CPC ... G11C 8/16; H01L 27/0207; H01L 27/1104; H01L 27/11; H01L 29/785
USPC ..... 365/154, 49.1, 156
See application file for complete search history.

(56) References Cited

U.S. PATENT DOCUMENTS

| | | | | |
|---|---|---|---|---|
| 5,289,432 | A | 2/1994 | Dhong et al. | |
| 6,084,820 | A | 7/2000 | Raszka | |
| 6,091,626 | A | 7/2000 | Madan | |
| 6,181,634 | B1 | 1/2001 | Okita | |
| 6,535,453 | B2 * | 3/2003 | Nii et al. | 365/230.05 |
| 6,627,960 | B2 * | 9/2003 | Nii et al. | 257/371 |
| 6,706,571 | B1 | 3/2004 | Yu et al. | |
| 6,807,081 | B2 * | 10/2004 | Nii | 365/145 |
| 6,858,478 | B2 | 2/2005 | Chau et al. | |
| 6,864,519 | B2 * | 3/2005 | Yeo et al. | 257/206 |
| 6,914,338 | B1 | 7/2005 | Liaw | |
| 6,977,837 | B2 * | 12/2005 | Watanabe et al. | 365/156 |

(Continued)

OTHER PUBLICATIONS

Bartiomiej Jan Pawlak, et al., U.S. Appl. No. 12/569,689, "Method of Fabricating Finfet Device," filed Sep. 29, 2009, 21 pages.

(Continued)

*Primary Examiner* — Angela M Lie
(74) *Attorney, Agent, or Firm* — Haynes and Boone, LLP

(57) ABSTRACT

The present disclosure provides a dual port static random access memory (SRAM) cell. The dual-port SRAM cell includes a first and second inverters cross-coupled for data storage, each inverter includes a pull-up device (PU) and a plurality of pull-down devices (PDs); a plurality of pass gate devices configured with the two cross-coupled inverters; and at least two ports coupled with the plurality of pass gate devices (PGs) for reading and writing, wherein each of PU, PDs and PGs includes a fin field-effect transistor (FinFET), a ratio between a number of PDs in the SRAM cell and a number of PGs in the SRAM cell is greater than 1, and a number of FinFETs in the SRAM cell is equal to or greater than 12.

30 Claims, 19 Drawing Sheets

(56) References Cited

U.S. PATENT DOCUMENTS

| | | | | |
|---|---|---|---|---|
| 7,002,258 | B2 | 2/2006 | Mali et al. | |
| 7,023,056 | B2 | 4/2006 | Liaw | |
| 7,026,689 | B2 | 4/2006 | Liaw | |
| 7,092,309 | B2 | 4/2006 | Liaw | |
| 7,112,857 | B2 | 9/2006 | Liaw | |
| 7,176,125 | B2 | 2/2007 | Liaw | |
| 7,187,036 | B2 | 3/2007 | Liaw | |
| 7,190,050 | B2 | 3/2007 | King et al. | |
| 7,233,032 | B2 | 6/2007 | Liaw | |
| 7,247,887 | B2 | 7/2007 | King et al. | |
| 7,250,657 | B2 | 7/2007 | Liaw | |
| 7,257,017 | B2 | 8/2007 | Liaw | |
| 7,265,008 | B2 | 9/2007 | King et al. | |
| 7,269,056 | B1 | 9/2007 | Liaw | |
| 7,271,451 | B2 | 9/2007 | Liaw | |
| 7,365,432 | B2 | 4/2008 | Liaw | |
| 7,403,413 | B2 | 7/2008 | Liaw | |
| 7,405,994 | B2 | 7/2008 | Liaw | |
| 7,419,898 | B2 | 9/2008 | Liaw | |
| 7,468,902 | B2 | 12/2008 | Liaw | |
| 7,485,934 | B2 | 2/2009 | Liaw | |
| 7,502,273 | B2 | 3/2009 | Liaw | |
| 7,505,354 | B2 | 3/2009 | Liaw | |
| 7,508,031 | B2 | 3/2009 | Liu et al. | |
| 7,514,757 | B2 | 4/2009 | Liaw | |
| 7,525,868 | B2 | 4/2009 | Liaw | |
| 7,528,465 | B2 | 5/2009 | King et al. | |
| 7,529,117 | B2 | 5/2009 | Liaw | |
| 7,577,040 | B2 | 8/2009 | Liaw | |
| 7,586,147 | B2 | 9/2009 | Liaw | |
| 7,592,675 | B2 | 9/2009 | Liaw | |
| 7,605,449 | B2 | 10/2009 | Liu et al. | |
| 7,660,149 | B2 | 2/2010 | Liaw | |
| 7,675,124 | B2 | 3/2010 | Liaw | |
| 7,679,947 | B2 | 3/2010 | Liaw | |
| 7,692,230 | B2 | 4/2010 | Liaw et al. | |
| 7,723,806 | B2 | 5/2010 | Liaw | |
| 7,738,282 | B2 | 6/2010 | Liaw et al. | |
| 7,812,407 | B2 | 10/2010 | Liaw | |
| 7,864,561 | B2 | 1/2011 | Liaw | |
| 7,906,389 | B2 | 3/2011 | Liaw | |
| 8,009,463 | B2 | 8/2011 | Liaw | |
| 8,120,939 | B2 | 2/2012 | Liaw | |
| 8,144,540 | B2 | 3/2012 | Liaw | |
| 8,174,868 | B2 | 5/2012 | Liaw | |
| 8,189,368 | B2 | 5/2012 | Liaw | |
| 8,218,354 | B2 | 7/2012 | Liaw et al. | |
| 8,258,572 | B2 | 9/2012 | Liaw | |
| 8,315,084 | B2 | 11/2012 | Liaw et al. | |
| 8,390,033 | B2 | 3/2013 | Liaw | |
| 8,399,935 | B2 | 3/2013 | Liaw | |
| 8,405,216 | B2 | 3/2013 | Liaw | |
| 8,421,130 | B2 | 4/2013 | Liaw et al. | |
| 8,472,227 | B2 | 6/2013 | Liaw | |
| 8,691,633 | B2 | 4/2014 | Liaw | |
| 8,737,107 | B2 | 5/2014 | Liaw | |
| 2005/0153490 | A1 | 7/2005 | Yoon et al. | |
| 2005/0247981 | A1 | 11/2005 | Wang | |
| 2005/0253287 | A1 | 11/2005 | Liaw | |
| 2007/0025132 | A1 | 2/2007 | Liaw | |
| 2007/0090428 | A1 | 4/2007 | Liaw | |
| 2007/0120156 | A1 | 5/2007 | Liu et al. | |
| 2007/0122953 | A1 | 5/2007 | Liu et al. | |
| 2007/0122954 | A1 | 5/2007 | Liu et al. | |
| 2007/0128782 | A1 | 6/2007 | Liu et al. | |
| 2007/0132053 | A1 | 6/2007 | King et al. | |
| 2007/0228372 | A1 | 10/2007 | Yang et al. | |
| 2007/0264762 | A1* | 11/2007 | Yeo | H01L 21/84 438/157 |
| 2008/0013383 | A1* | 1/2008 | Venkatraman et al. | 365/189.04 |
| 2008/0019171 | A1 | 1/2008 | Liaw | |
| 2008/0258228 | A1 | 10/2008 | Chuang et al. | |
| 2008/0263492 | A1 | 10/2008 | Chuang et al. | |
| 2008/0290470 | A1 | 11/2008 | King et al. | |
| 2008/0296632 | A1 | 12/2008 | Moroz et al. | |
| 2009/0035909 | A1 | 2/2009 | Chang et al. | |
| 2009/0181477 | A1 | 7/2009 | King et al. | |
| 2010/0006945 | A1 | 1/2010 | Merelle et al. | |
| 2010/0006974 | A1 | 1/2010 | Xu et al. | |
| 2010/0052059 | A1 | 3/2010 | Lee | |
| 2010/0183961 | A1 | 7/2010 | Shieh et al. | |
| 2010/0203734 | A1 | 8/2010 | Shieh et al. | |
| 2010/0264468 | A1 | 10/2010 | Xu | |
| 2011/0012202 | A1* | 1/2011 | Chang | H01L 21/845 257/350 |

OTHER PUBLICATIONS

Hsien-Hsin Lin, et al., U.S. Appl. No. 12/703,918, "Method for Fabricating a Finfet Device," filed Feb. 11, 2010, 40 pages.

Chien-Chang Su, et al., U.S. Appl. No. 12/644,869, "Method for Incorporating Impurity Element in EPI Silicon Process," filed Dec. 22, 2009, 21 pages.

Tsung-Lin Lee, et al., U.S. Appl. No. 12/622,038, "Sacrificial Offset Protection Film for a Finfet Device," filed Nov. 19, 2009, 56 pages.

Jeff J. Xu, et al., US. Appl. No. 12/784,207, "Method of Forming EPI Film in Substrate Trench," filed May 20, 2010, 33 pages.

Tian-Choy, et al., U.S. Appl. No. 12/756,552, "Hybrid Gate Process for Fabricating Finfet Device," filed Apr. 8, 2010, 38 pages.

Ming-Lung Cheng, et al. U.S. Appl. No. 12/780,124, "Method and Apparatus for Enhancing Channel Strain," filed May 14, 2010, 35 pages.

Jhon Jhy Liaw, U.S. Appl. No. 12/827,406, "Rom Cell Circuit for Finfet Devices," filed Jun. 30, 2010, 32 pages.

Jhon Jhy Liaw, U.S. Appl. No. 12/823,860, "Structure and Method for SRAM Cell Circuit," filed Jun. 25, 2010, 37 pages.

Jhon Jhy Liaw, et al., U.S. Appl. No. 12/827,690, "Layout for Multiple-Fin SRAM Cell," filed Jun. 30, 2010, 35 pages.

Jeng-Jung Shen, et al., U.S. Appl. No. 12/780,060, "Automatic Layout Conversion for Finfet Device," filed May 14, 2010, 29 pages.

Jeng-Jung Shen, et al., U.S. Appl. No. 12/780,426, "Finfet Boundary Optimization," filed May 14, 2010, 28 pages.

Yu-Lien Huang, et al., U.S. Appl. No. 12/840,830, "High Surface Dopant Concentration Semiconductor Device and Method of Fabricating," filed Jul. 21, 2010, 21 pages.

Peng-Soon Lim, et al., U.S. Appl. No. 12/827,512, "Gate Structures and Method of Fabricating Same," filed Jun. 30, 2010, 41 pages.

Tsu-Hsiu Perng, et al., U.S. Appl. No. 12/837,093, "Fin-Like Field Effect Transistor (Finfet) Device and Method of Manufacturing Same," filed Jul. 15, 2010, 30 pages.

Clement Hsingjen Wann et al., U.S. Appl. No. 12/834,617, "In-Situ Spectrometry," filed Jul. 12, 2010, 20 pages.

Chia-Chung Chen, et al., U.S. Appl. No. 12/871,476, "Gate Controlled Bipolar Junction Transistor on Fin-Like Field Effect Transistor (Finfet) Structure," filed Aug. 30, 2010, 30 pages.

Jeff J. Xu, et al, U.S. Appl. No. 12/906,820, "Fin-Like Field Effect Transistor (Finfet) Device and Method of Manufacturing Same," filed Oct. 18, 2010, 55 pages.

Jeff J. Csu, et al, U.S. Appl. No. 12/917,902, "Fin-Like Field Effect Transistor (FINFET) Device and Method of Manufacturing Same," filed Nov. 2, 2010, 61 pages.

Mark van Dal, U.S. Appl. No. 12/900,895, "Method of Fabricating a Semiconductor Device Having an Epitaxly Region," filed Oct. 8, 2010, 21 pages.

Hsin-Chih Chen, et al, U.S. Appl. No. 12/907,272, "Multi-Fin Device by Self-Aligned Castle Fin Formation," filed Oct. 19, 2010, 34 pages.

Chien-Hsun Wang, et al, U.S. Appl. No. 12/952,376, "Method for Adjusting Fin Width in Integrated Circuitry," filed Nov. 23, 2010, 27 pages.

Chien-Shun Wang, et al, U.S. Appl. No. 12/949,881, "Method for Forming Metrology Structures From Fins in Integrated Circuitry," filed Nov. 19, 2010, 16 pages.

Chien-Hsun Wang, et al, U.S. Appl. No. 12/953,148, "Device and Method for Forming Fins in Integrated Circuitry," filed Nov. 23, 2010, 39 pages.

(56) References Cited

OTHER PUBLICATIONS

Koji Nii at al., "27.9—A 90nm Dual-Port SRAM with 2.04 $\mu m^2$ 8T-Thin Cell Using Dymanically-Controlled Column Bias Scheme" ISSCC 2004 / Session 27 / SRAM / 27.9, 2004 IEEE International Solid-State Circuits Conference 0-7803-8267-6/04, 2004 IEEE, 10 pages.
Application for related matter U.S. Appl. No. 12/827,406, filed Jun. 30, 2010 32 pages.
Application for related matter U.S. Appl. No. 12/832,860, filed Jun. 25, 2010, 38 pages.
Application for related matter U.S. Appl. No. 12/827,690, filed Jun. 30, 2010, 36 pages.
Application for related matter U.S. Appl. No. 12/721,476, filed Mar. 10, 2010 37 pages.

* cited by examiner

CELL STRUCTURE FOR DUAL-PORT SRAM

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCE

The present disclosure is related to the following commonly-assigned U.S. patent applications, the entire disclosures of which are incorporated herein by reference: U.S. Ser. No. 12/721,476 filed Mar. 10, 2010 by the same inventor Jhon Jhy Liaw for "FULLY BALANCED DUAL-PORT MEMORY CELL".

BACKGROUND

In deep sub-micron integrated circuit technology, an embedded static random access memory (SRAM) device has become a popular storage unit of high speed communication, image processing and system-on-chip (SOC) products. For example, a dual port (DP) SRAM device allows parallel operation, such as IR (read) 1W (write), or 2R (read) in one cycle, and therefore has higher bandwidth than a single port SRAM. In advanced technologies with decreased feature size and increased packing density, low loading and high speed of the cell structure are important factors in embedded memory and SOC products. The thin style SRAM cell structure with short bit-line (BL) provides better performance on BL RC delay. However, the thin style cell structure suffers some problems including data node leakage, devices matching of pull-down (PD)/pass-gate (PG) devices and current crowding, etc. Special operation mode (parallel operation) of the DP SRAM requests more pull down drive capability to cover two-ports of the ON operation mode. This further requires double beta ratio setting for static noise margin (SNM). As such, the PD device width will be around 2× from the single-port cell. To consider reasonable SNM, the device width ratio between PD and PG is around 2~4 on the DP cell. This results in an L-shape or T-shape layout of the drain node of the PD device, and therefore may suffer the above problems. It is therefore desired to have a new structure and method to address the above issues.

SUMMARY

The present disclosure provides one embodiment of a dual port static random access memory (SRAM) cell. The dual-port SRAM cell includes a first and second inverters cross-coupled for data storage, each inverter includes a pull-up device (PU) and a plurality of pull-down devices (PDs); a plurality of pass gate devices configured with the two cross-coupled inverters; and at least two ports coupled with the plurality of pass gate devices (PGs) for reading and writing, wherein each of PU, PDs and PGs includes a fin field-effect transistor (FinFET), a ratio between a number of PDs in the SRAM cell and a number of PGs in the SRAM cell is greater than 1, and a number of FinFETs in the SRAM cell is equal to or greater than 12.

The present disclosure also provides another embodiment of a dual port SRAM cell. The SRAM cell includes a first set of fin field-effect transistors (FinFETs) having two pull-up devices (PUs), a first number of pull-down devices (PDs) configured to form first and second cross-coupled inverters; a second set of FinFETs having a second number of pass-gate devices (PGs) configured to form at least two ports, wherein a ratio between the first number and the second number is greater than 1.

The present disclosure also provides yet another embodiment of a dual port SRAM cell. The dual port SRAM cell includes a first inverter having a first pull-up transistor (PU1) and a first group of pull-down transistors (PDs); a second inverter having a second pull-up transistor (PU2) and a second group of PDs, the second inverter being cross-coupled with the first inverter; a first group of pass-gate transistors (PGs) coupled with the first and second inverters to form a first port; and a second group of PGs coupled with the first and second inverters to form a second port, wherein each of the PDs and PGs includes a n-type fin field-effect transistor (nFinFET) and each of the pull-up transistors includes a p-type fin field-effect transistor (pFinFET), and a ratio between a number of PDs and a number of PGs in the SRAM cell is greater than 1.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Various drawings and associated text are provided in a Power Point file. Particularly.

DETAILED DESCRIPTION

Figure 1:
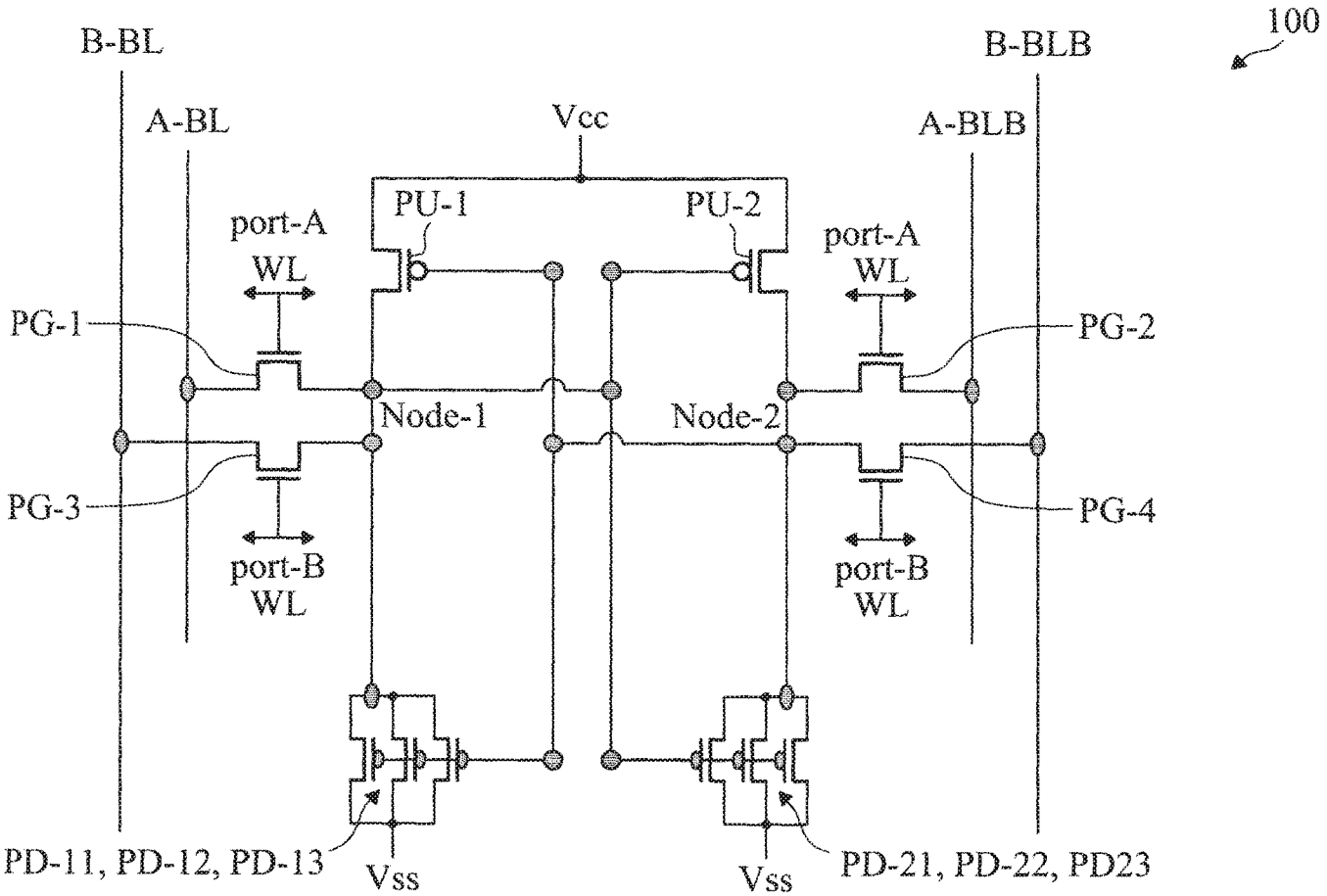
FIG. 1 is a schematic view of a dual port static random access memory (DP SRAM) device constructed according to various aspects of the present disclosure in one embodiment.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic view of a dual-port (DP) SRAM cell 100 constructed according to various aspects of the present disclosure in one embodiment. The DP SRAM cell 100 includes fin field-effect transistors (FinFETs). The DP SRAM cell 100 includes a first and second inverters that are cross-coupled. The first inverter includes a first pull-up device formed with a p-type fin field-effect transistor (pFinFET), referred to as PU-1. The first inverter also includes a first plurality of pull-down devices formed with n-type fin field-effect transistors (nFinFETs) and configured in parallel mode. Specifically, the drains of the first plurality pull-down devices are electrically connected together, the corresponding sources are electrically connected together, and the corresponding gates are electrically connected together. The second inverter includes a second pull-up device formed with a pFinFET, referred to as PU-2. The second inverter also includes a second plurality of pull-down devices formed with nFinFETs and configured in parallel mode. The number of the first plurality of pull-down devices and the number of the second plurality of pull-down devices are equal for a balanced cell structure. In one embodiment, the first plurality of pull-down devices includes 3 nFinFETs, referred to as PD-11, PD-12 and PG-13, respectively. In one embodiment, the second plurality of pull-down devices include 3 nFinFETs, referred to as PD-21, PD-22 and PG-23, respectively.

The drains of PU-1, PD-11, PD-12 and PD-13 are electrically connected together, defining a first drain node (or first node). The drains of PU-2, PD-21, PD-22 and PD-23 are electrically connected together, defining a second drain node (or second node). The gates of PU-1, PD-11, PD-12 and PD-13 are electrically connected and coupled to the second node. The gates of PU-2, PD-21, PD-22 and PD-23 are electrically connected and coupled to the first node. The sources of PU-1 and PU-2 are electrically connected to the power line (Vcc line). The sources of PD-11, PD-12, PD-13, PD-21, PD-22 and PD-23 are electrically connected to a complementary power line (Vss line). In one embodiment of the DP SRAM cell layout, the sources of PD-11, PD-12 and PD-13 are electrically connected to a first Vss line while the sources of PD-21, PD-22 and PD-23 are electrically connected to a second Vss line.

The DP SRAM cell 100 further includes a first port (port-A) and a second port (port-B). In one embodiment, the port-A and port-B include at least four pass-gate devices, referred to as PG-1, PG-2, PG-3 and PG-4, respectively. The pass-gate devices each includes a nFinFET. The port-A includes a first pass-gate device (PG-1) and a second pass-gate device (PG-2). The port-B includes a third pass-gate device (PG-3) and a fourth pass-gate device (PG-4). The drain of PG-1 is electrically connected to a first bit-line (referred to as A_BL). The source of PG-1 is electrically connected to the first node. The gate of PG-1 is electrically connected to a first word-line (referred to as port-A WL). The drain of PG-2 is electrically connected to a first bit-line bar (A_BLB). The source of PG-2 is electrically connected to the second node. The gate of PG-2 is electrically connected to a first word-line (port-A WL). The drain of PG-3 is electrically connected to a second bit-line (B_BL). The source of PG-3 is electrically connected to the first node. The gate of PG-3 is electrically connected to the second word-line (port-B WL). The drain of PG-4 is electrically connected to a second bit-line bar (B_BLB). The source of PG-4 is electrically connected to the second node. The gate of PG-4 is electrically connected to the second word-line (port-B WL). Various nFinFETs and pFinFETs may be formed by any proper technology. In one embodiment, the various nFinFETs and pFinFETs are formed by a process including etching a semiconductor to form trenches, partially filling the trenches to form shallow trench isolation (STI) features and fin active regions. In furtherance of the present embodiment, an epitaxy semiconductor layer is selectively formed on the fin active region. In another embodiment, the various FinFETs are formed by a process including depositing a dielectric material layer on the semiconductor substrate, etching the dielectric material layer to form openings thereof, selective epitaxy growing a semiconductor material (such as silicon) on the semiconductor substrate within the openings to form fin active regions and STI features. In another embodiment, the various FinFETs may include strained features for enhanced mobility and device performance. For example, the pFinFETs include epitaxy grown silicon germanium on a silicon substrate. The pFinFETs include epitaxy grown silicon carbide on the silicon substrate. In another embodiment, the various FinFETs are formed using high k/metal gate technology.

The cell 100 may include additional devices such as additional pull-down devices and pass-gate devices. Specifically, the first inverter includes a number of pull-down devices configured in parallel similar to the configuration of PD-11, PD-12 and PD-13. More specifically, the drains of the pull-down devices in the first inverter are electrically connected together. The sources of the pull-down devices in the first inverter are electrically connected together. The gates of the pull-down devices in the first inverter are electrically connected together or formed with one continuous gate. The second inverter includes the same number of pull-down devices configured in parallel similar to the configuration of PD-21, PD-22 and PD-23 for balance. Specifically, the drains of the pull-down devices in the second inverter are electrically connected together. The sources of the pull-down devices in the second inverter are electrically connected together. The gates of the pull-down devices in the second inverter are electrically connected together or formed with one continuous gate.

The first port includes the first pass-gate device or a number of the first pass-gate devices (still referred to PG-1) configured in parallel. Specifically, the number of the first pass-gate devices are configured such that the drains, sources and gates are electrically connected together, respectively. More specifically, the drains of the first pass-gate devices (PG-1) are electrically connected to a first bit-line (A_BL). The sources of PG-1 are electrically connected to the first node. The gates of PG-1 is electrically connected to a first word-line (port-A WL).

Similarly, the first port includes the second pass-gate device or the same number of the second pass-gate devices (still referred to PG-2) configured in parallel. Specifically, the number of the second pass-gate devices are configured such that the drains, sources and gates are electrically connected together, respectively. More specifically, the drains of PG-2 are electrically connected to a first bit-line bar (A_BLB). The sources of PG-2 are electrically connected to the second node. The gates of PG-2 are electrically connected to a first word-line (port-A WL).

The second port includes the third pass-gate device or the same number of the third pass-gate devices (still referred to PG-3) configured in parallel. Specifically, the number of the third pass-gate devices are configured such that the drains, sources and gates are electrically connected together, respectively. More specifically, the drains of PG-3 are electrically connected to a second bit-line (B_BL). The sources of PG-3 are electrically connected to the first node. The gates of PG-3 are electrically connected to the second word-line (port-B WL).

The second port includes the fourth pass-gate device or the same number of the fourth pass-gate devices (still referred to PG-4) configured in parallel. Specifically, the number of the fourth pass-gate devices are configured such that the drains, sources and gates are electrically connected together, respectively. More specifically, the drains of PG-4 are electrically connected to a second bit-line bar (B_BLB). The sources of PG-4 are electrically connected to the second node. The gates of PG-4 are electrically connected to the second word-line (port-B WL).

In the SRAM cell 100, the number of the pull-down devices is greater than the number of the pass-gate devices. Specifically, a ratio "R" is defined as R=Npd/Npg where Npd is a number of the pull-down devices in a SRAM cell and Npg is a number of the pass gate devices in the SRAM cell. The ratio R is greater than 1 to increase sink current, access speed, and device reliability of the SRAM cell. For examples, the ratio is 3/2, 2, or 5/4. The total number of the nFinFETs and pFinFETs in the cell is greater than 12 such that the ratio R is tuned to be greater than 1 in the disclosed configuration. In the present embodiment illustrated in FIG. 1, the ratio R is 3/2 and the total FinFETs in one SRAM cell is 12.

Figure 2:
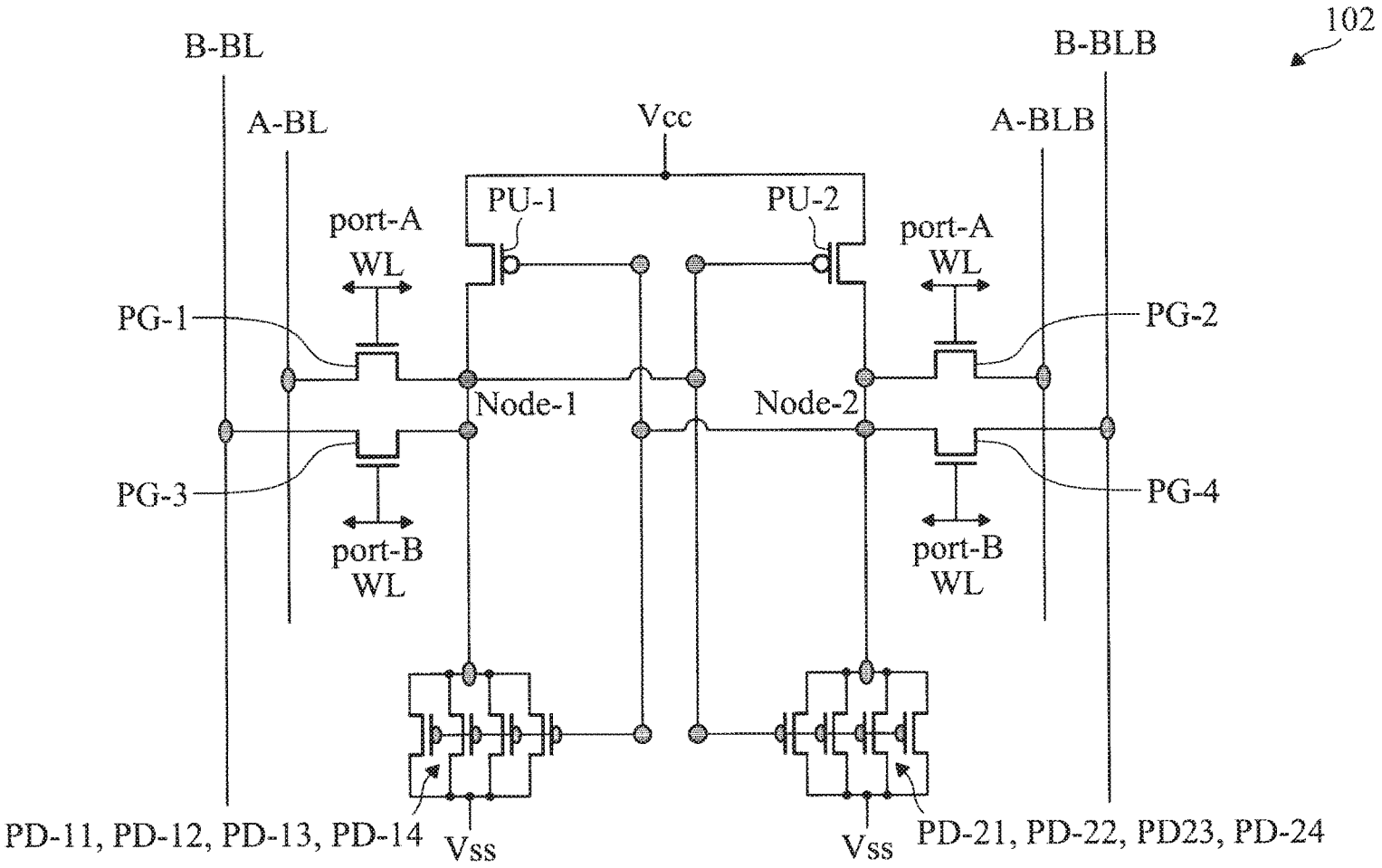
FIG. 2 is a schematic view of a DP SRAM device constructed according to various aspects of the present disclosure in another embodiment.

FIG. 2 is a schematic view of a dual-port (DP) SRAM cell 102 constructed according to various aspects of the present disclosure in another embodiment. The SRAM cell 102 is similar to the SRAM cell 100 of FIG. 1 except the first inverter includes 4 pull-down devices PD-11, PD-12, PD-13 and PD-14. Likewise, the second inverter includes 4 pull-down devices PD-21, PD-22, PD-23 and PD-24 for a balanced configuration. In this particular embodiment, the ratio R is 4/2=2. The SRAM cell 102 has a total of 14 FinFETs.

Figure 3:
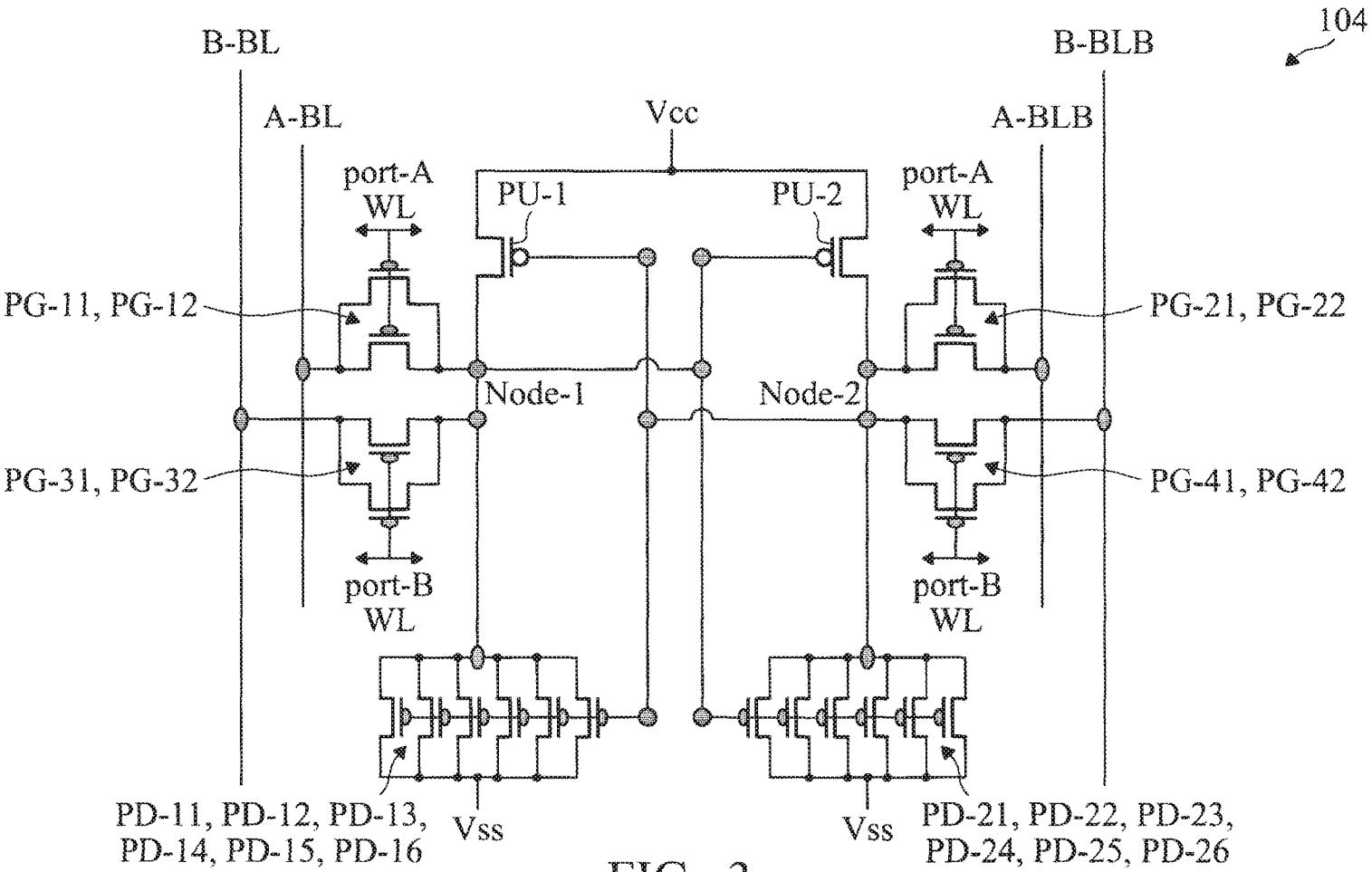
FIG. 3 is a schematic view of a DP SRAM device constructed according to various aspects of the present disclosure in another embodiment.

FIG. 3 is a schematic view of a dual-port (DP) SRAM cell 104 constructed according to various aspects of the present disclosure in another embodiment. The SRAM cell 104 is similar to the SRAM cell 100 of FIG. 1 except for both the number of the pull-down devices and the number of the pass gate devices are doubled. In the SRAM cell 104, the first inverter includes 6 pull-down devices PD-11, PD-12, PD-13, PD-14, PD-15 and PD-16. The second inverter includes 6 pull-down devices PD-21, PD-22, PD-23, PD-24, PD-25 and PD-26. Additionally, the SRAM cell 104 includes 8 pass gate devices configured to form the first and second ports. Specifically, the port-A includes 4 pass-gate devices PG-11, PG-12, PG-21 and PG-22. The port-B includes 4 pass-gate devices PG-31, PG-32, PG-41 and PG-42. The drains of PG-11 and PG-12 are electrically connected to a first bit-line (A_BL). The sources of PG-11 and PG-12 are electrically connected to the first node. The gates of PG-11 and PG-12 are electrically connected to a first word-line (referred to as port-A WL). The drains of PG-21 and PG-22 are electrically connected to a first bit-line bar (A_BLB). The sources of PG-21 and PG-22 are electrically connected to the second node. The gates of PG-21 and PG-22 are electrically connected to a first word-line (port-A WL). The drains of PG-31 and PG-32 are electrically connected to a second bit-line (B_BL). The sources of PG-31 and PG-32 are electrically connected to the first node. The gates of PG-31 and PG-32 are electrically connected to the second word-line (port-B WL). The drains of PG-41 and PG-42 are electrically connected to a second bit-line bar (B_BLB). The sources of PG-41 and PG-42 are electrically connected to the second node. The gates of PG-41 and PG-42 are electrically connected to the second word-line (port-B WL). In the present embodiment, the ratio R is 6/4=3/2. The SRAM cell 104 has a total of 22 FinFETs.

Figure 4:
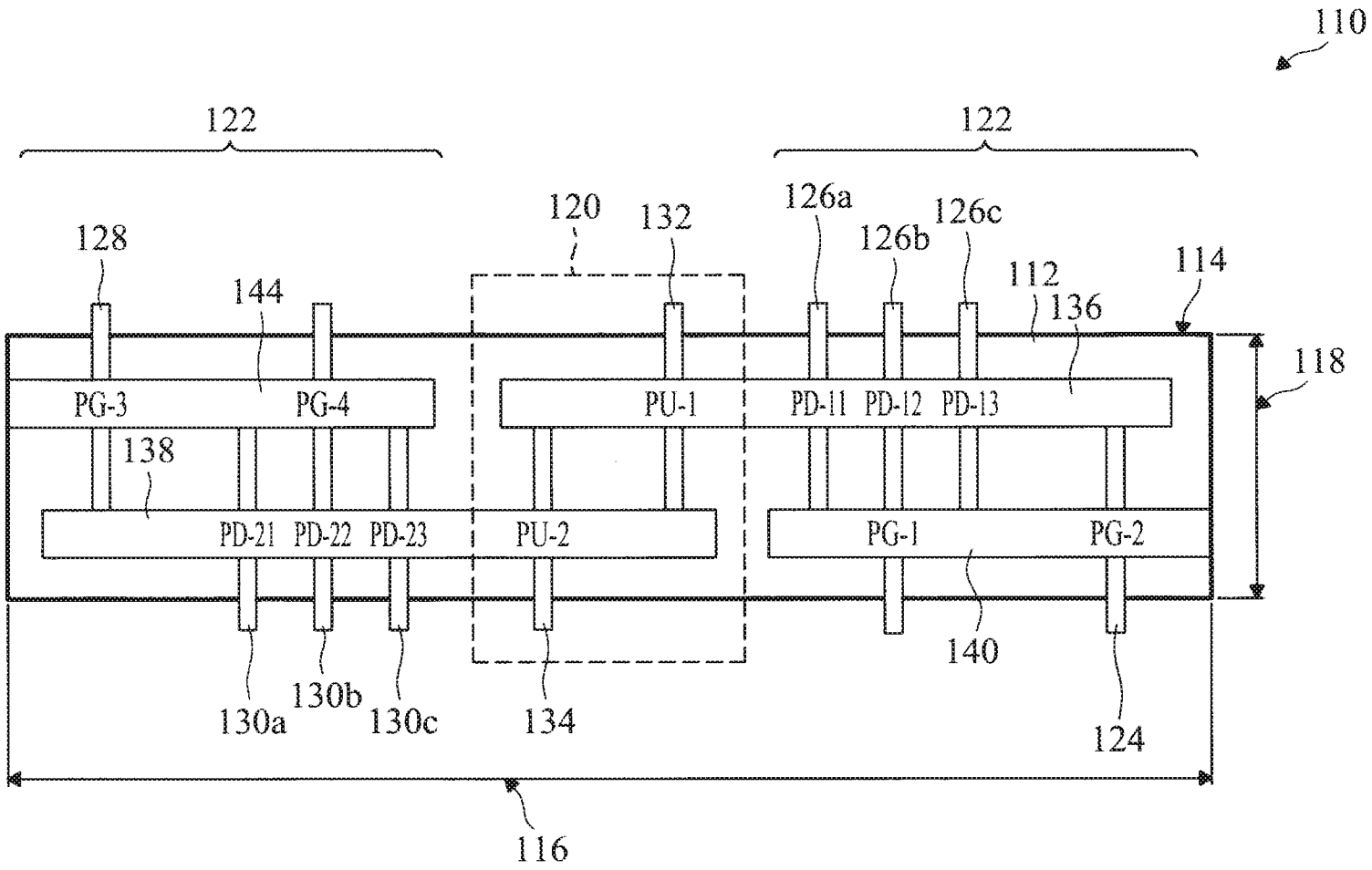
FIGS. 4 and 5 are top views of a DP SRAM device constructed according to various aspects of the present disclosure in one embodiment.

FIG. 4 is a top view of a DP SRAM cell 110 constructed according to various aspects of the present disclosure in one embodiment. In one embodiment, the DP SRAM cell 110 is a portion of the DP SRAM cell 100 in a particular configuration. The DP SRAM cell 110 includes one cell of DP SRAM and is formed on a semiconductor substrate. The semiconductor substrate includes silicon. Alternatively, the substrate includes germanium, silicon germanium or other proper semiconductor materials. The semiconductor substrate may include other proper features and structures. In one embodiment, the semiconductor substrate employs a layer of semiconductor material formed over an insulating layer on a supporting bulk wafer for isolation. The technology and structure are referred to as semiconductor on isolation (SOI). The SOI structure can be formed by different techniques including separation by implanted oxygen (SIMOX), bonding and etching back (BESOI), and zone melting and recrystallization (ZMR).

The DP SRAM cell 110 is formed in a unit cell region 112 of the semiconductor substrate. The unit cell region 112 is defined by the unit cell boundary 114. In one embodiment, the unit cell region 112 is defined in a rectangular shape spanning to a first dimension 116 in a first direction and spanning to a second dimension 118 in a second direction perpendicular to the first direction. The first dimension 116 is longer than the second dimension 118. The first and second dimensions (116 and 118) are referred to as a longer pitch and a shorter pitch, respectively. The first and second directions are also referred to by numerals 116 and 118, respectively. The SRAM cell 110 includes a N-well region 120 disposed in the central portion of the cell. The SRAM cell 110 further includes a P-well region 122 disposed on the both sides of the N-well 120. In one embodiment, the N-well 120 and P-well 122 are extended to multiple cells beyond the unit cell boundary. For example, the N-well 120 and P-well 122 are extended to 4 or more cells in the second direction.

Various active regions are defined in the substrate by isolation features and are isolated from each other by the isolation features. The isolation features are formed in the semiconductor substrate with a proper technology. In one embodiment, the isolation features are formed by a shallow trench isolation (STI) technique. In another embodiment, the isolation features are alternatively formed by a local oxidation of silicon (LOCOS) technique. In yet another embodiment, the formation of the STI features includes etching a trench in a substrate and filling the trench by one or more insulator materials such as silicon oxide, silicon nitride, or silicon oxynitride. The filled trench may have a multi-layer structure such as a thermal oxide liner layer with silicon nitride filling the trench. The active regions are defined in the semiconductor substrate upon the formation of the isolation features.

The DP SRAM cell 110 utilizes fin active regions (fin active features) to form fin transistors, such as FinFETs. The fin active regions are formed on the semiconductor substrate and defined within the SRAM cell 110. The fin active regions is formed by a suitable technology and may be formed in a process to form both the STI features and the fin active regions. In one embodiment, the fin active regions are formed by a process including etching a semiconductor to form trenches, partially filling the trenches to form shallow trench isolation (STI) features and fin active regions interdigitized with each other. In furtherance of the present embodiment, an epitaxy semiconductor layer is selectively formed on the fin active region. In another embodiment, the fin active regions are formed by a process including depositing a dielectric material layer on a semiconductor substrate, etching the dielectric material layer to form openings thereof, and selective epitaxy growing a semiconductor material (such as silicon) on the semiconductor substrate within the openings to form fin active regions and the isolation features. In yet another embodiment, the various FinFETs may include strained features for enhanced mobility and device performance. For example, the pFinFETs include epitaxy grown silicon germanium on a silicon substrate. The pFinFETs include epitaxy grown silicon carbide on the silicon substrate.

In one embodiment, the DP SRAM cell 110 includes a first active region 124, a second active region 126, a third active region 128 and a fourth active region 130 formed in the P-well 122. The DP SRAM cell 110 further includes a fifth active region 132 and a sixth active region 134 formed in the N-well 120. The first active region 124 through the sixth active region 134 are disposed along the second dimension. The first through sixth active regions or a subset thereof may be extended to multiple cells, such as 4 or more cells in the second direction.

In one embodiment, each of the active regions includes one or more fin active features configured to form various FinFETs. In another embodiment, at least some of the first active region 124 through the fourth active region 130 in the P-well 122 include multiple fin active features. In each fin active feature, a pull-down device (PD), a pass-gate device (PG), or a combination thereof can be formed. Particularly, each fin active feature includes one PD, one PG, two PDs, two PGs, or PD/PG (one PD and one PG). In the present embodiment, the first active region 124 includes one fin active feature (still referred to as 124) oriented in the second direction 118. The pass-gate PG-2 is formed on the fin active feature 124. The second active feature 126 includes three fin active features lined up, referred to as 126a, 126b and 126c, respectively. The fin active feature 126b is interposed between the fin active features 126a and 126c. The pull-down devices PD 11, PD-12 and PD-13 are formed on the fin active features 126a, 126b and 126c, respectively. The fin active feature 126b is extended longer than the fin active features 126a and 126c. The pass-gate device PG-1 is formed on the fin active feature 126b as illustrated in FIG. 4.

Similarly, for a balanced structure of the SRAM cell 110, the third active region 128 includes one fin active feature (still referred to as 128) oriented in the second direction 118. The pass-gate PG-3 is formed on the fin active feature 128. The fourth active feature 130 includes three fin active features lined up, referred to as 130a, 130b and 130c, respectively. The fin active feature 130b is interposed between the fin active features 130a and 130c. The pull-down devices PD-21, PD-22 and PD-23 are formed on the fin active features 130a, 130b and 130c, respectively. The fin active feature 130b is extended longer than the fin active features 130a and 130c. The pass-gate device PG-4 is formed on the fin active feature 130b as illustrated in FIG. 4.

Various gate features are formed within the DP SRAM cell 110 for various nFinFETs and pFinFETs. A gate feature includes a gate dielectric layer (such as silicon oxide) and a gate electrode (such as doped polysilicon) disposed on the gate dielectric layer. In another embodiment, the gate feature alternatively or additionally includes other proper materials for circuit performance and manufacturing integration. For example, the gate dielectric layer includes high k dielectric material layer. The gate electrode includes metal, such as aluminum, copper, tungsten or other proper conductive material. Various gates are oriented in the first direction 116 and configured with the various active regions to form the pull-up devices, pull-down devices and pass-gate devices.

In the present embodiment, a long gate 136 is disposed over the fin active features 126a, 126b and 126c and further extends over the fifth active feature 132, forming PD-11, PD-12, PD-13 and PU-1, respectively. Similarly, another long gate 138 is disposed over the fin active features 130a, 130b and 130c and further extended over the sixth active feature 134, forming PD-21, PD-22, PD-23 and PU-2, respectively. A short gate 140 is disposed on the active features 124 and 126b and configured to form PG-2 and PG-1, respectively. Similarly, another short gate 144 is disposed on the active features 128 and 130b and configured to form PG-3 and PG-4, respectively.

In another embodiment of the configuration as illustrated in FIG. 4, the first active region 124 through the fourth active region 130 in the P-well 122 and the associated pull-down devices and pass-gate devices are symmetrically disposed on the two sides of the N-well 120 with symmetrical interconnect routing.

Figure 5:
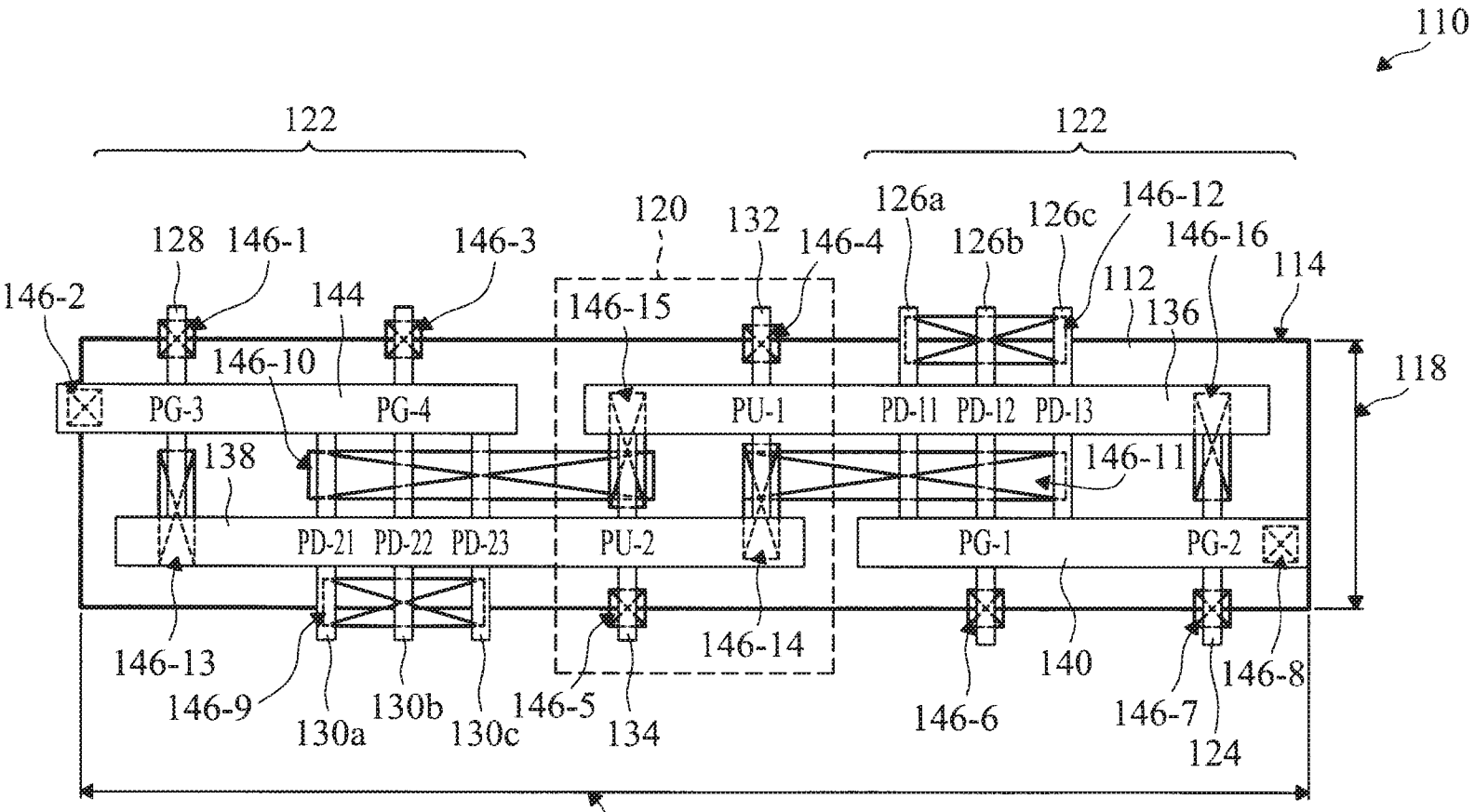

FIG. 5 illustrates a top view of the DP SRAM cell 110, including interconnect routings. Various interconnect structures may be utilized to couple the nFinFETs and pFinFETs to form the functional DP SRAM cell. In one embodiment, the drain of PD-12 is electrically connected to the source of PG-1 by sharing a common doped region, a region defined in the fin active region 126b and positioned between the PD-12 and PG-1.

In another embodiment, the drain of PD-12 is electrically connected to the source of PG-1 by a silicide feature (not shown) formed on the common doped region within the fin active region 126b. The silicide feature is formed by a process known in the art such as self-aligned silicide (salicide) and can be formed together with other contact silicide in a same processing procedure.

In yet another embodiment, the drain of PD-12 is electrically connected to the source of PG-1 by a contact feature designed to contact both the drain of PD-12 and the source of PG-1. The geometries of the contacts are to be further described later. Similarly, the drain of PD-22 and the source of PG-4 are electrically connected in a way similar to the connection between the drain of PD-12 and the source of PG-1, such as by a silicide feature.

The source of the pass-gate PG-2 is configured to electrically connect to the gate 136 by various interconnect technique. In one embodiment, the interconnect between the source to the gate is achieved by a local interconnect (LI) technology. In one embodiment, the local interconnect is formed using the gate electrode material, such as polysilicon. In this situation, the polysilicon is used not only to form gate electrode but also to form interconnect. More particularly, the gate electrode is extended to the targeted source region and directly lands on the silicon substrate within the targeted source region.

Alternatively, if the gate electrode is a metal gate, then the metal gate is extended to form the local interconnect. The LI features and gates are formed during a same processing procedure. In another embodiment, this routing can be alternatively achieved by an intra-cell routing through a contact feature designed to land on both the targeted gate and the source. Similarly, the source of PG-3 is electrically connected to the gate 138.

Referring to FIG. 5, the DP SRAM cell 110 further includes various contacts (shown as ⊠ and labeled as 126) on gates, drain nodes, Vss connection, and various landing pads (such as silicide feature). The contact features are positioned and configured for routing including electrically connecting the doped regions or the gates to a metal layer. Additionally or alternatively, the contact features are designed to have various geometries to function as a local interconnect.

In one embodiment, one or more contact features in the SRAM cell 110 are designed in a square shape for normal contact function, such as contact features 146-1 through 146-8. In one example, contact features 146-1 through 146-8 are routed to the corresponding metal lines in the first metal layer or the second metal layer. In another embodiment, one or more contact features are designed in a rectangular shape oriented in the first direction 116 to function as contacting drains (or sources) of the multiple pull-down devices in the same inverter, such as those contact features 146-9 through 146-12. In another embodiment, one or more contact features are designed in a rectangular shape oriented in the second direction 118 to function as contacting a drain/source feature to a gate, such as those contact features 146-13 through 146-16.

In various embodiments, the contact feature 146-1 is routed to the bit-line BL-B; the contact feature 146-2 is routed to the word-line WL-B; the contact feature 146-3 is routed to the bit-line BL-B-bar; the contact feature 146-4 is routed to the Vcc power line; the contact feature 146-5 is routed to the Vcc power line; the contact feature 146-6 is routed to the bit-line BL-A-bar; the contact feature 146-7 is routed to the bit-line BL-A; the contact feature 146-8 is routed to the word-line WL-A; the contact feature 146-9 is routed to the complimentary power line Vss; the contact feature 146-10 is designed to electrically connect the drains of PD-21, PD-22, PD-23 and PU-2; the contact feature 146-12 is designed to electrically connect the drains of PD-11, PD-12, PD-13 and PU-1; the contact feature 146-12 is routed to the complimentary power line Vss; the contact feature 146-13 is designed to electrically connect the gate 138 and the source of the PG-3; the contact feature 146-14 is designed to electrically connect the gate 138 and the drain of the PU-1; the contact feature 146-15 is designed to electrically connect the gate 136 and the drain of the PU-2; and the contact feature 146-16 is designed to electrically connect the gate 136 and the source of the PG-2.

Figure 6:
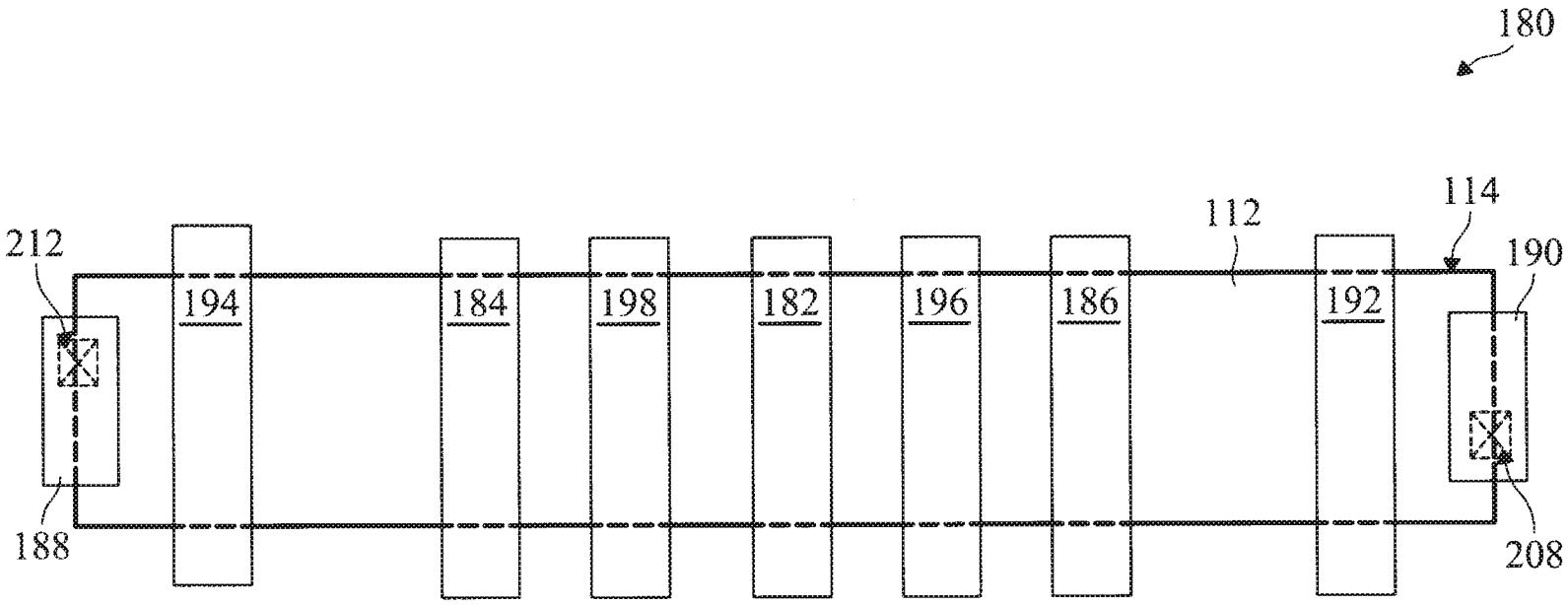
FIGS. 6 and 7 are top views of a portion of a DP SRAM device constructed according to various aspects of the present disclosure in various embodiments.
Figure 7:
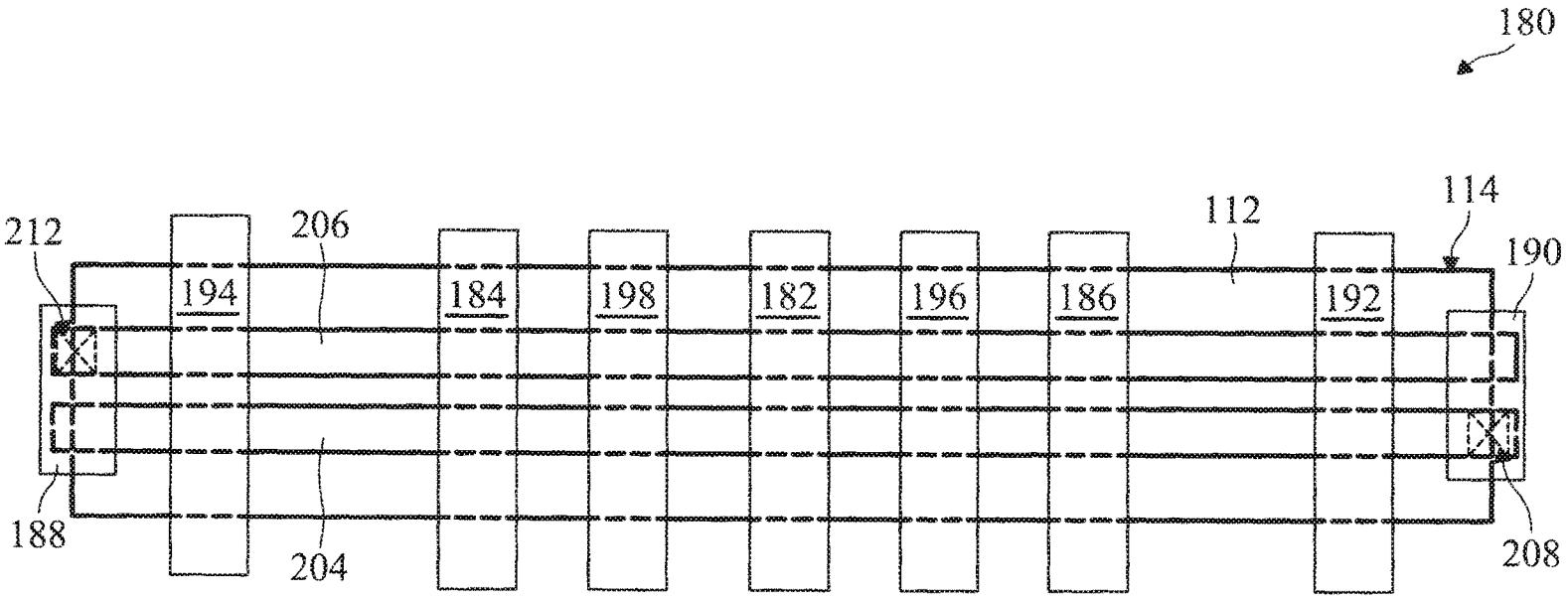

FIGS. 6 and 7 are top views of the DP SRAM cell 110 constructed according to various aspects of the present disclosure in one embodiment. More particularly, various interconnect structures 180 in the DP SRAM cell 110 are constructed and presented in FIGS. 6 and 7. In one embodiment, the DP SRAM cell 110 includes at least three interconnect layers (i.e. metal layers). The contact features are described with reference to FIG. 5. The interconnect structure 180 of the DP SRAM cell 110 includes a second interconnect layer (referred to as second metal layer or M2) disposed over the first metal layer, and a third interconnect layer (referred to as third metal layer or M3) disposed over the second metal layer. The previously described elements of the DP SRAM cell 110 are eliminated from FIG. 6 for simplicity.

Referring to FIG. 6, the second metal layer includes various metal lines substantially aligned in the second direction of the DP SRAM cell 110. In one embodiment, the second metal layer includes a power line (Vcc line) 182. The Vcc line 182 is electrically connected to the Vcc landing pads through the respective contacts. The Vcc line 182 is substantially positioned in the center portion of the cell 112 in the first dimension of the cell. The second metal layer also includes complementary power lines, such as first Vss line 184 and the second Vss line 186 positioned at both sides of the Vcc line 182. The first and second Vss lines (184 and 186) are electrically connected to the first and second Vss connects, respectively.

The second metal layer includes first word lines (WL-A) 188 and 190 positioned on the border of the cell, respectively. The first word lines 188 and 190 are electrically connected to the first and second word contacts 146-2 and 146-8 of FIG. 5. The second metal layer includes a first bit line (A-BL) 192 and a second bit line (B-BL) 194 electrically connected to the corresponding bit-line contacts 146-7 and 146-1 of FIG. 5, respectively. The second metal layer includes a first bit line bar (A-BL-bar) 196 and a second bit line bar (B-BL-bar) 198 electrically connected to the corresponding bit-line contacts 146-6 and 146-3 of FIG. 5, respectively. In various embodiments, the metal lines in the second metal layer have different configurations.

Still referring to FIG. 6, various vias for coupling the second metal layer to the third metal layer are properly configured and formed on the second metal layer. In one embodiment, the vias on the second metal layer include a first via 208 landing on the first word line 190 of the second metal layer, a second via 212 landing on the first word line 188 of the second metal layer. In the present embodiment, at least one of the Vdd line and the Vss lines is configured between the two bit-lines for noise shielding.

Referring to FIG. 7, the interconnect structure 180 of the DP SRAM cell 110 includes various metal lines in the third metal layer for word line routing. The metal lines in the third metal layer are substantially aligned along the first direction of the cell 110. The third metal layer includes a first word line (WL-A) 204 and a second word line (WL-B) 206. The first word line 204 is electrically connected to the gates of PG-1 and PG-2 through the first via 208. The second word line 206 is electrically connected to the gates of PG-3 and PG-4 through the second via 212.

The various metal lines may be configured and/or assigned differently according to the configurations of the various pull-up devices, pull-down devices and pass-gate devices. In an alternative embodiment with reference to FIGS. 6 and 7, the second metal layer includes a first bit line bar (A-BL-bar) 192 and a second bit line (B-BL) 194 electrically connected to the corresponding bit-line contacts 146-7 and 146-1 of FIG. 5, respectively. The second metal layer includes a first bit line (A-BL) 196 and a second bit line bar (B-BL-bar) 198 electrically connected to the corresponding bit-line contacts 146-6 and 146-3 of FIG. 5, respectively.

Figure 8:
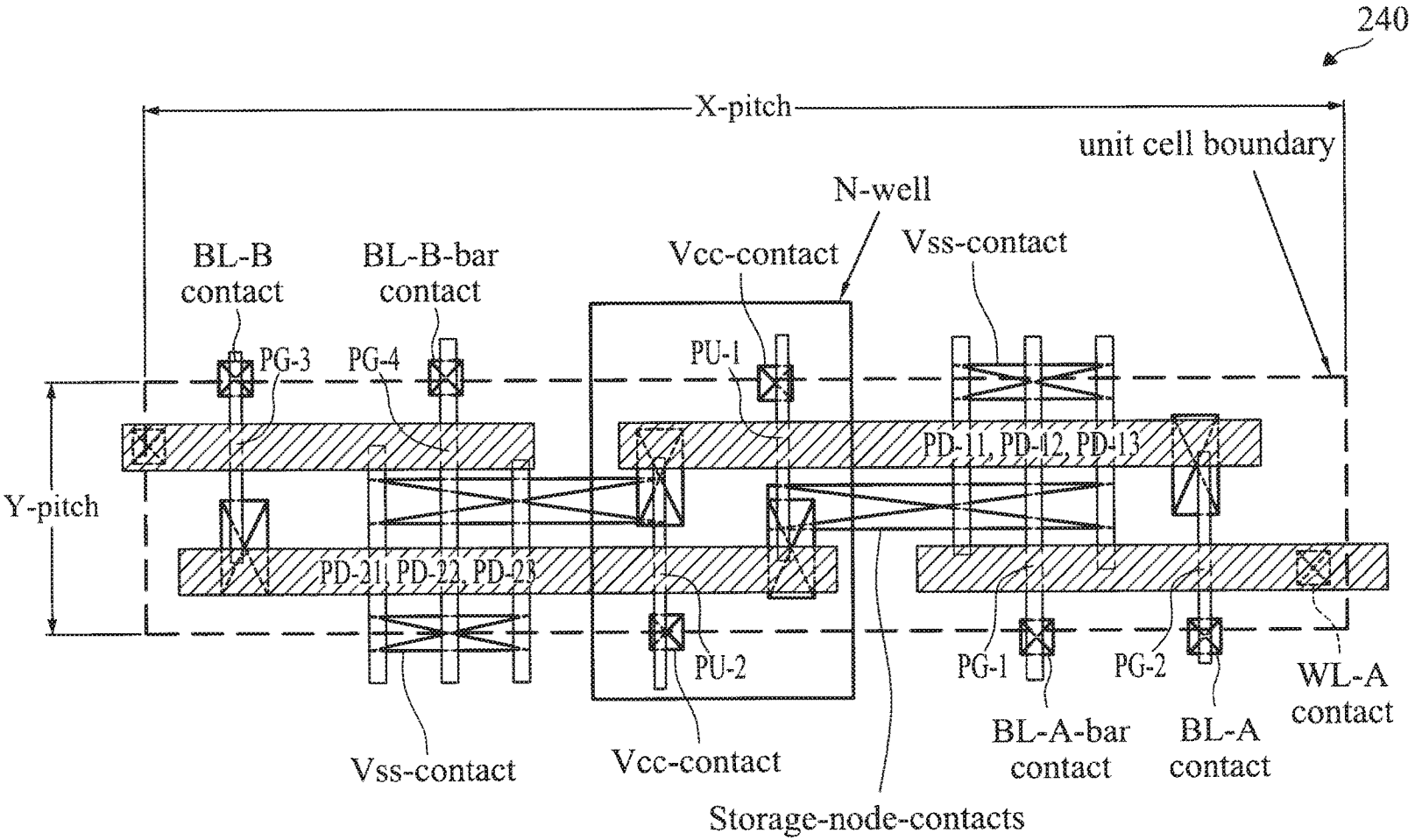
FIGS. 8-16, 18-19 are top views of a DP SRAM device or a portion thereof constructed according to various aspects of the present disclosure in various embodiments.

FIG. 8 is a top view of a DP SRAM device 240 in another embodiment, similar to the SRAM cell 110 of FIG. 5. The differences between FIG. 8 and FIG. 5 in the configuration are self-explained from the layouts and are not further described in detail. In one embodiment, the DP SRAM cell 240 is a portion of the DP SRAM cell 100 of FIG. 1 in a particular configuration. The ratio R of the DP SRAM cell 240 is 3/2.

Figure 9:
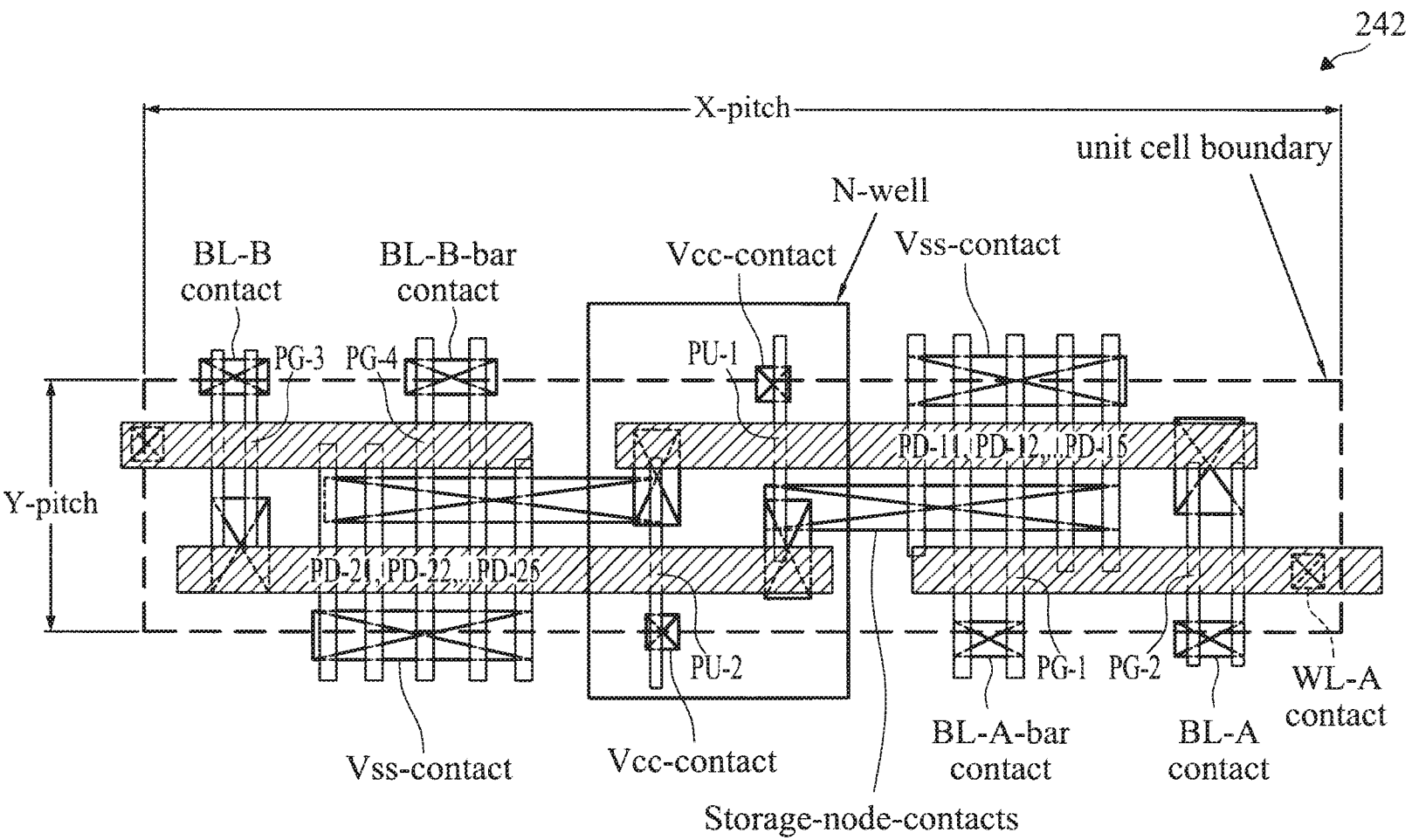

FIG. 9 is a top view of a DP SRAM device 242 in another embodiment. In one embodiment, the first inverter of the DP SRAM cell 242 includes 5 pull-down devices formed of FinFETs PD-11, PD-12, PD-13, PD-14 and PD-15. The second inverter of the DP SRAM cell 242 includes 5 pull-down devices formed of FinFETs PD-21, PD-22, PD-23, PD-24 and PD-25. The pass-gate device PG-1 through PG-4 each includes two nFinFETs. The ratio R of the DP SRAM cell 242 is 5/4.

Figure 10:
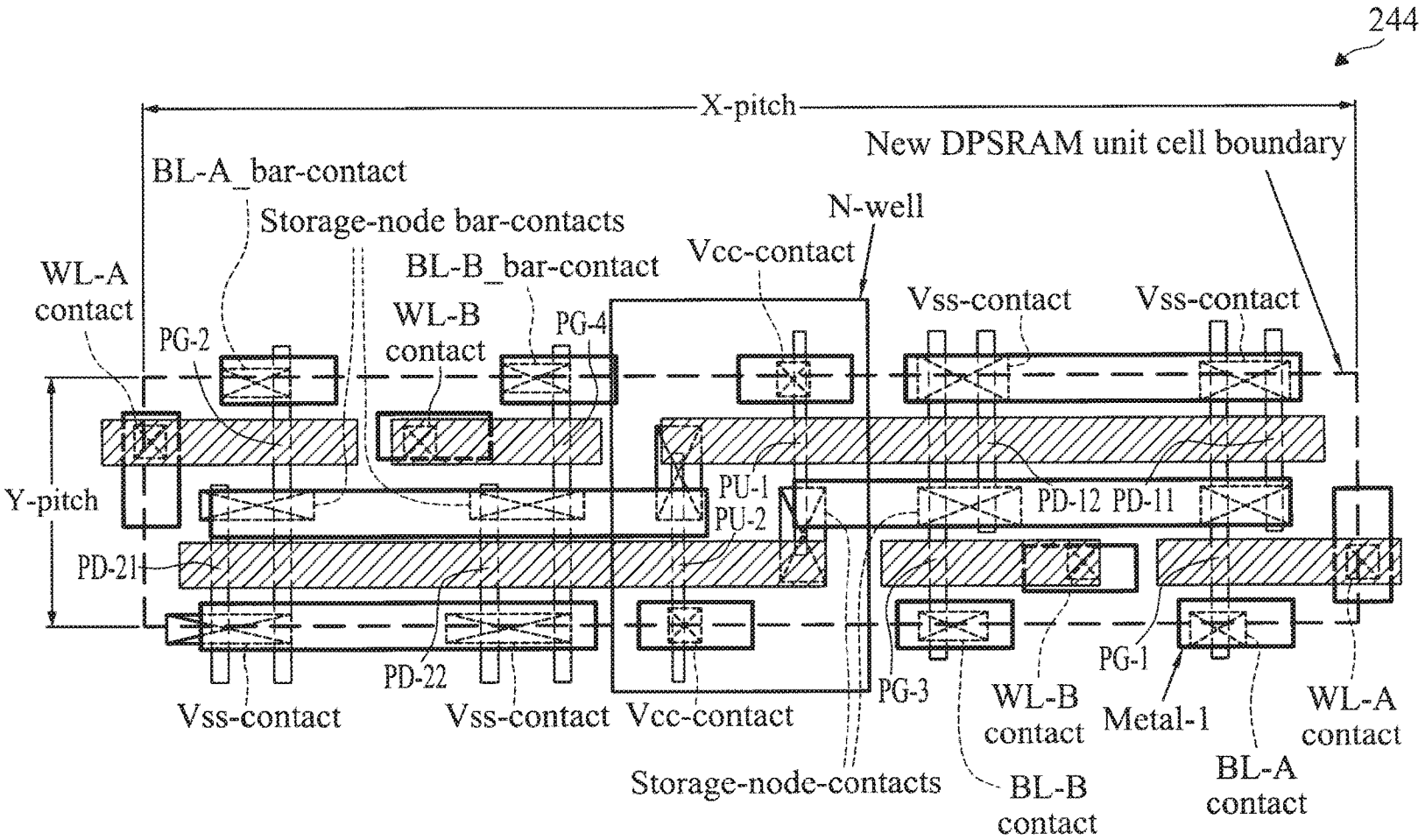

FIG. 10 is a top view of a DP SRAM device 244. In one embodiment, the first inverter of the DP SRAM cell 242 includes 4 pull-down devices. More specifically, the pull-down device PD-11 includes 2 nFinFETs formed in the P-well. Similarly, each of the pull-down devices PD-12, PD-21 and PD-22 includes 2 nFinFETs formed in the P-well. The ratio R of the DP SRAM cell 244 is 2/1.

Figure 11:
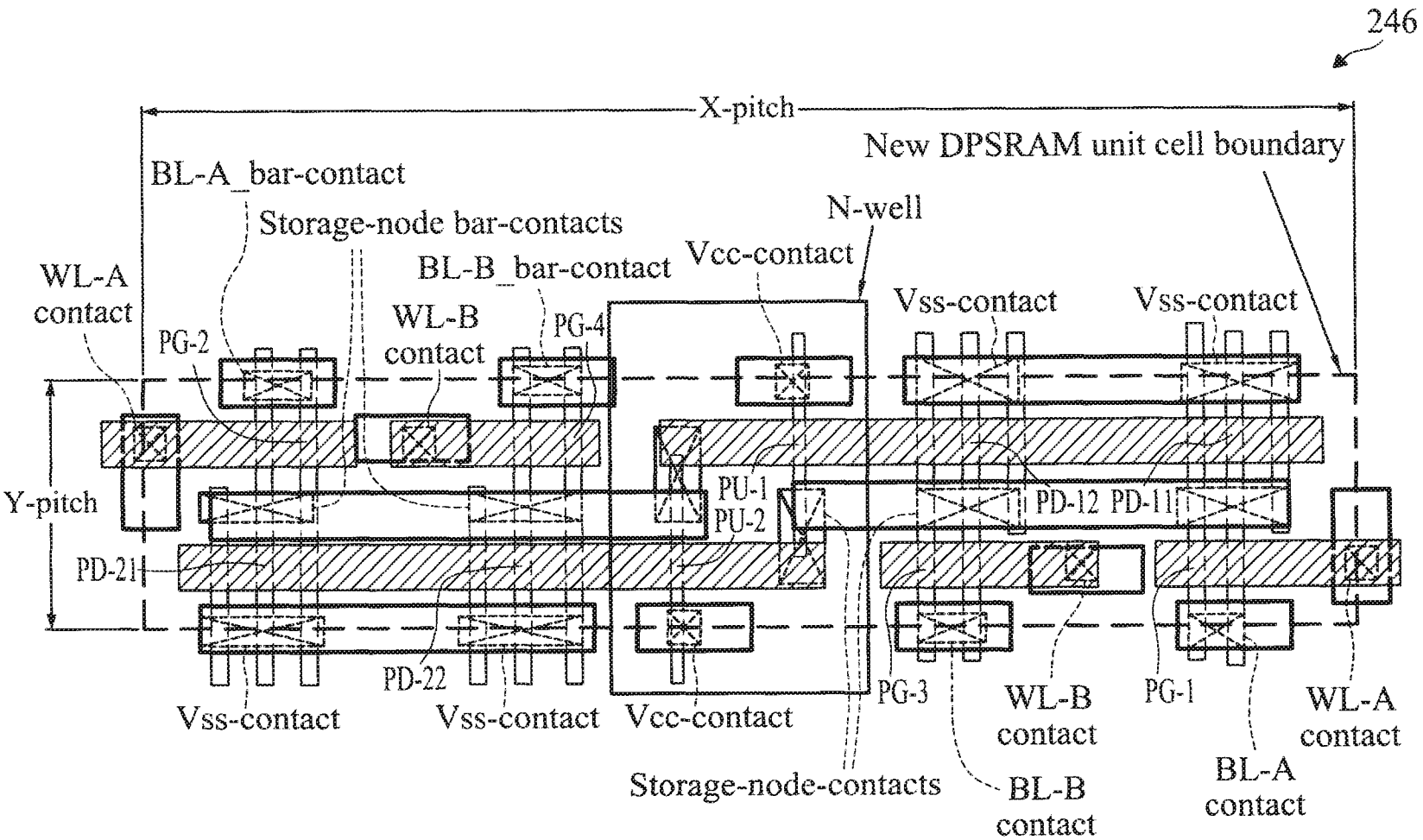

FIG. 11 is a top view of a DP SRAM device 246. In one embodiment, each of the pull-down devices PD-11, PD-12, PD-21 and PD-22 includes 3 nFinFETs formed on the P-well. Each of the pass-down devices PG-1, PG-2, PG-3 and PG-4 includes 2 nFinFETs formed in the P-well. The ratio R of the DP SRAM cell 246 is 3/2.

Figure 12:
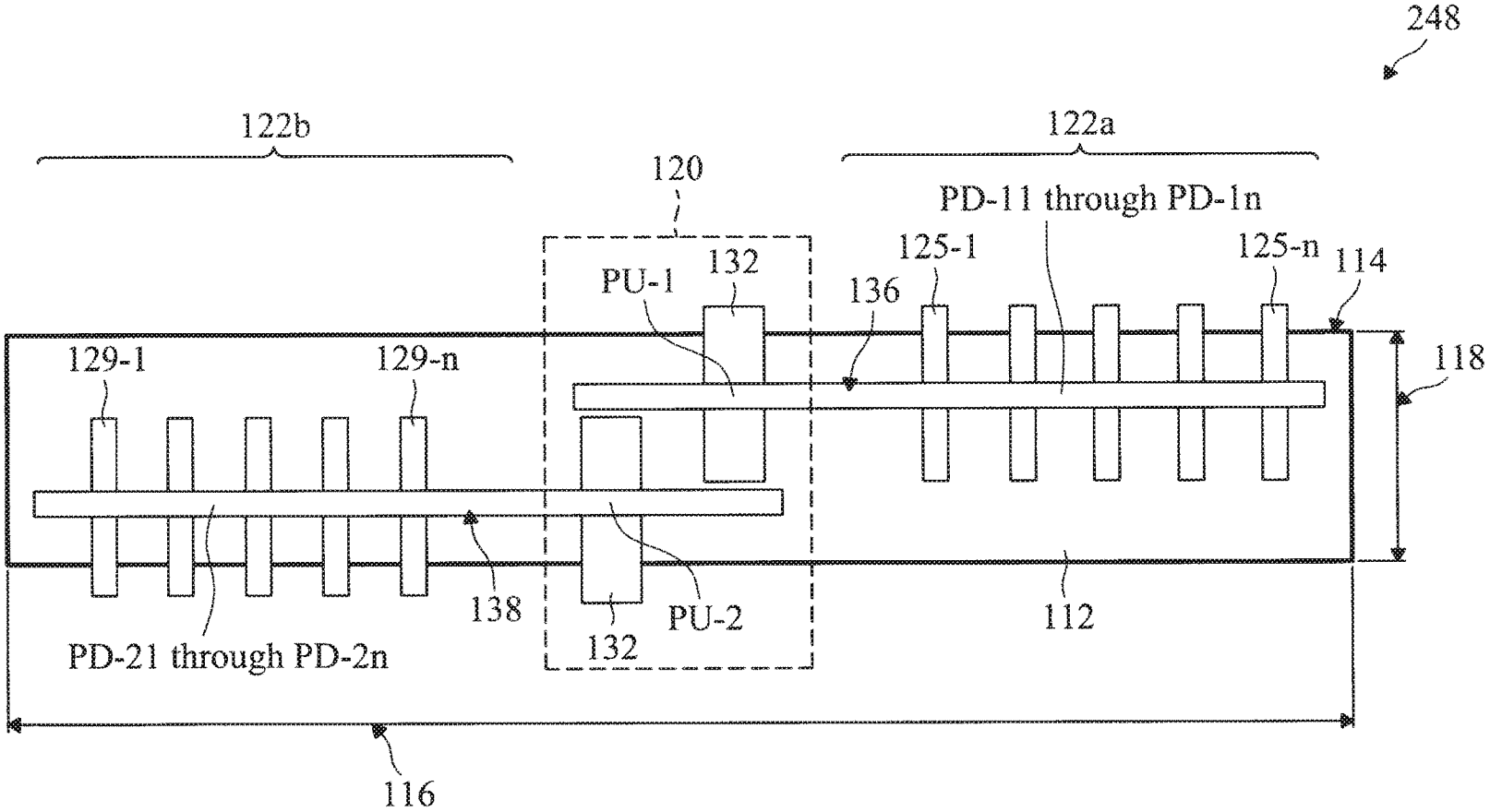

In another embodiment, FIG. 12 is a top view of a SRAM cell 248. In FIG. 12, some features are eliminated for simplicity. The similar features illustrated in FIG. 12 use similar numerals of FIG. 4. The pull-up devices, pull-down devices and pass-gate devices are all formed as FinFETs. The DP SRAM cell 248 is designed have a rectangular shape with a long dimension (length) along a first direction 116 and a short dimension (width) along the second direction 118. The DP SRAM includes a N-well 120 disposed in the center of the cell and a P-well disposed on the both side portions (first portion 122a and second portion 122b) of the SRAM cell 248. Two or more fin active features 132 and 134 are formed in the N-well 120 and oriented in the second direction 118. The two fin active features 132 and 134 are configured to form two pull-up devices PU-1 and PU-2. A plurality of fin active features are formed in the P-well and oriented in the second direction.

The plurality of fin active features are configured to form various pull-down devices and pass-gate devices. The number of the pull-down devices and number of the pass-gate devices are chosen such that the ratio R is greater than 1. Particularly, the fin active features 125-1 through 125-n are formed in the first portion of the P-well 122a. The pull-down devices PD-11 through PD-1n of the first inverter are lined up in parallel and formed in the first portion 122a of the P-well. The parameter "n" is an integer. Only 5 fin active features and 5 pull-down devices are shown in FIG. 12 for illustration. The parameter "n" is not limited to 5. The various gates are oriented in the first direction 116. A first gate 136 is designed as a straight line, formed in the first portion of the P-well, oriented in the first direction and crossed over the corresponding fin active features 125-1 through 125-n to form the pull-down devices PD-11 through PD-1n of the first inverter. The first gate is further extended to the N-well and configured to form the PU-1. Thus the gates of the pull-down devices and pull-up device(s) of the first inverter are intrinsically connected.

The second inverter is designed and configured similarly to form a balanced structure. In one embodiment, the fin active features 129-1 through 129-n are formed in the second portion of the P-well 122b. The pull-down devices PD-21 through PD-2n of the second inverter are lined up in parallel and formed in the second portion 122b of the P-well. A second gate 138 is designed as a straight line, formed in the second portion of the P-well, oriented in the first direction and crossed over the corresponding fin active features 129-1 through 129-n to form the pull-down devices PD-21 through PD-2n of the second inverter. The second gate 138 is further extended to the N-well and configured to form the PU-2. Thus the gates of the pull-down devices and pull-up device(s) of the second inverter are intrinsically connected. The SRAM cells in FIGS. 4 and 8-11 are several exemplary embodiments of the SRAM cell 248.

Figure 13:
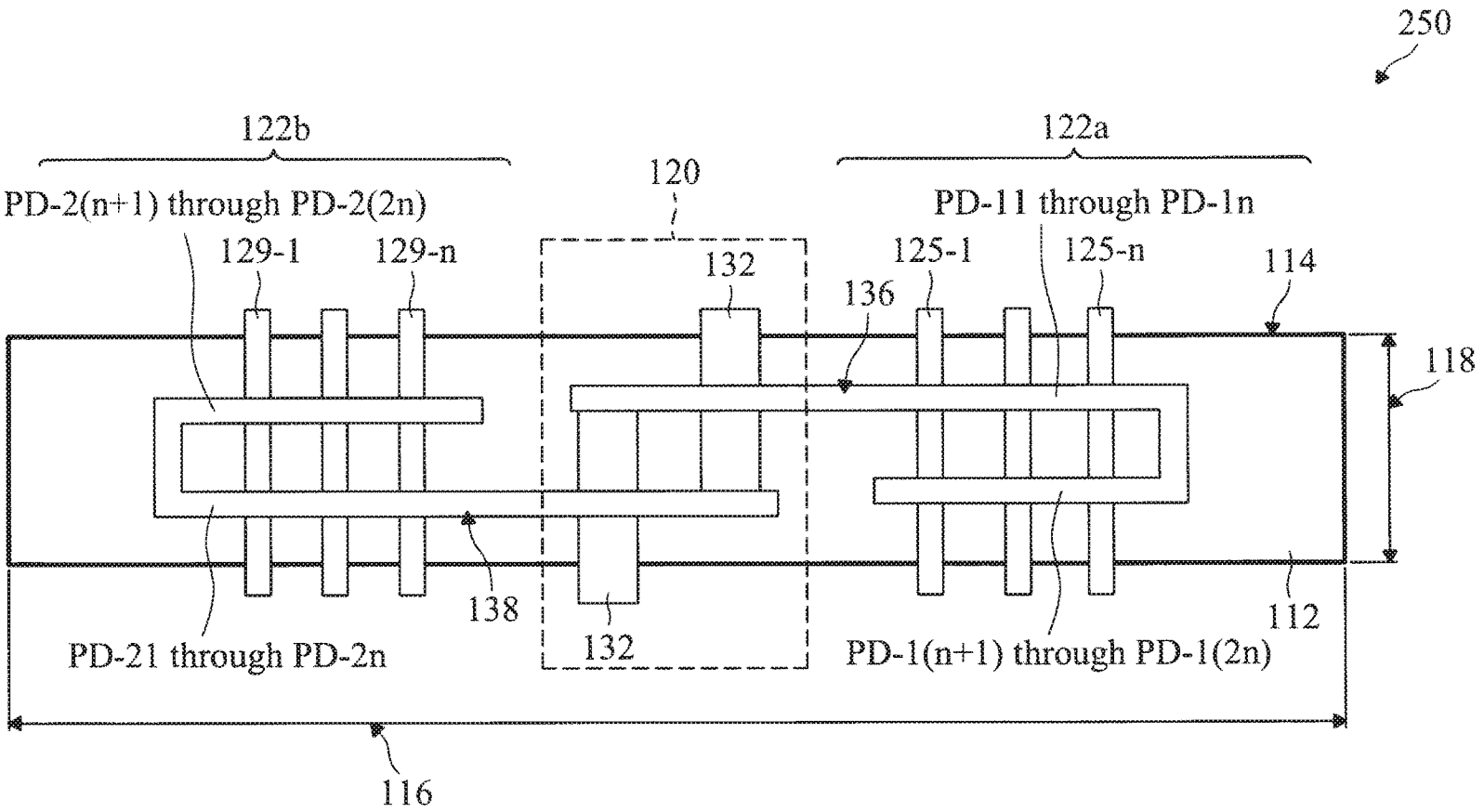

FIG. 13 is a top view of a SRAM cell 250 in another embodiment. In FIG. 13, some features are eliminated for simplicity. The similar features illustrated use similar numerals of the FIG. 4. The pull-up devices, pull-down devices and pass-gate devices are all formed as FinFETs. The DP SRAM cell 250 is designed have a rectangular shape with a long dimension (length) along a first direction 116 and a short dimension (width) along the second direction 118. The DP SRAM includes a N-well 120 disposed in the center of the cell and a P-well disposed on the both side portions (first portion 122a and second portion 122b) of the SRAM cell. Two or more fin active features 132 and 134 are formed in the N-well 120 and oriented in the second direction 118. The two fin active features 132 and 134 are configured to form two pull-up devices PU-1 and PU-2.

A plurality of fin active features are formed in the P-well and oriented in the second direction. The plurality of fin active features are configured to form various pull-down devices and pass-gate devices. The number of the pull-down devices and number of the pass-gate devices are chosen such that the ratio R is greater than 1. Particularly, the fin active features 125-1 through 125-n are formed in the first portion of the P-well 122a. The pull-down devices PD-11 through PD-1n of the first inverter are lined up in parallel and formed on the corresponding fin active features 125-1 through 125-n within the first portion 122a of the P-well, respectively. The parameter "n" is an integer. Only 3 fin active features and 3 pull-down devices are shown in FIG. 13 for illustration. The parameter "n" is not limited to 3. Furthermore, the pull-down devices PD-1(n+1) through PD-1(2n) of the first inverter are paired with the pull-down devices PD-11 through PD-1n, respectively, lined up in parallel and formed on the corresponding fin active features 125-1 through 125-n, as illustrated in FIG. 13.

A first gate 136 is designed to include three portions. The first portion of the first gate 136 is designed as a straight line, formed in the first portion of the P-well, oriented in the first direction and crossed over the corresponding fin active features 125-1 through 125-n to form the pull-down devices PD-11 through PD-1n of the first inverter. The second portion of the first gate 136 is also designed as a straight line, formed in the first portion of the P-well, oriented in the first direction and crossed over the corresponding fin active features 125-1 through 125-n to form the pull-down devices PD-1(n+1) through PD-1(2n) of the first inverter. The first portion of the first gate 136 is further extended to the N-well and configured to form the pull-up device PU-1. The first gate 136 further includes a third portion designed as a straight line oriented in the second direction 118 and is connected to the first and second portions of the first gate 136. Thus the gates of the pull-down devices and pull-up device(s) of the first inverter are intrinsically connected.

The second inverter is designed and configured similarly to form a balanced structure. In one embodiment, the fin active features 129-1 through 129-n are formed in the second portion of the P-well 122b. The pull-down devices PD-21 through PD-2n of the second inverter are lined up in parallel and formed on the corresponding fin active features 129-1 through 129-n within the second portion 122b of the P-well, respectively. Furthermore, the pull-down devices PD-2(n+1) through PD-2(2n) of the second inverter are paired with the pull-down devices PD-21 through PD-2n, respectively, lined up in parallel and formed on the corresponding fin active features 129-1 through 129-n, as illustrated in FIG. 13.

A second gate 138 is designed to include three portions. The first portion of the second gate 138 is designed as a straight line, formed in the second portion of the P-well, oriented in the first direction and crossed over the corresponding fin active features 129-1 through 129-n to form the pull-down devices PD-21 through PD-2n of the second inverter. The second portion of the second gate 138 is also designed as a straight line, formed in the second portion of the P-well, oriented in the first direction and crossed over the corresponding fin active features 129-1 through 129-n to form the pull-down devices PD-2(n+1) through PD-2(2n) of the second inverter. The first portion of the second gate 138 is further extended to the N-well and configured to form the pull-up device PU-2. The second gate 138 further includes a third portion designed as a straight line oriented in the second direction 118 and is connected to the first and second portions of the second gate 138. Thus the gates of the pull-down devices and pull-up device(s) of the second inverter are intrinsically connected. In another embodiment, the pass-gates may be similarly paired such that each fin active feature includes two pass-gate fin transistors.

Figure 14:
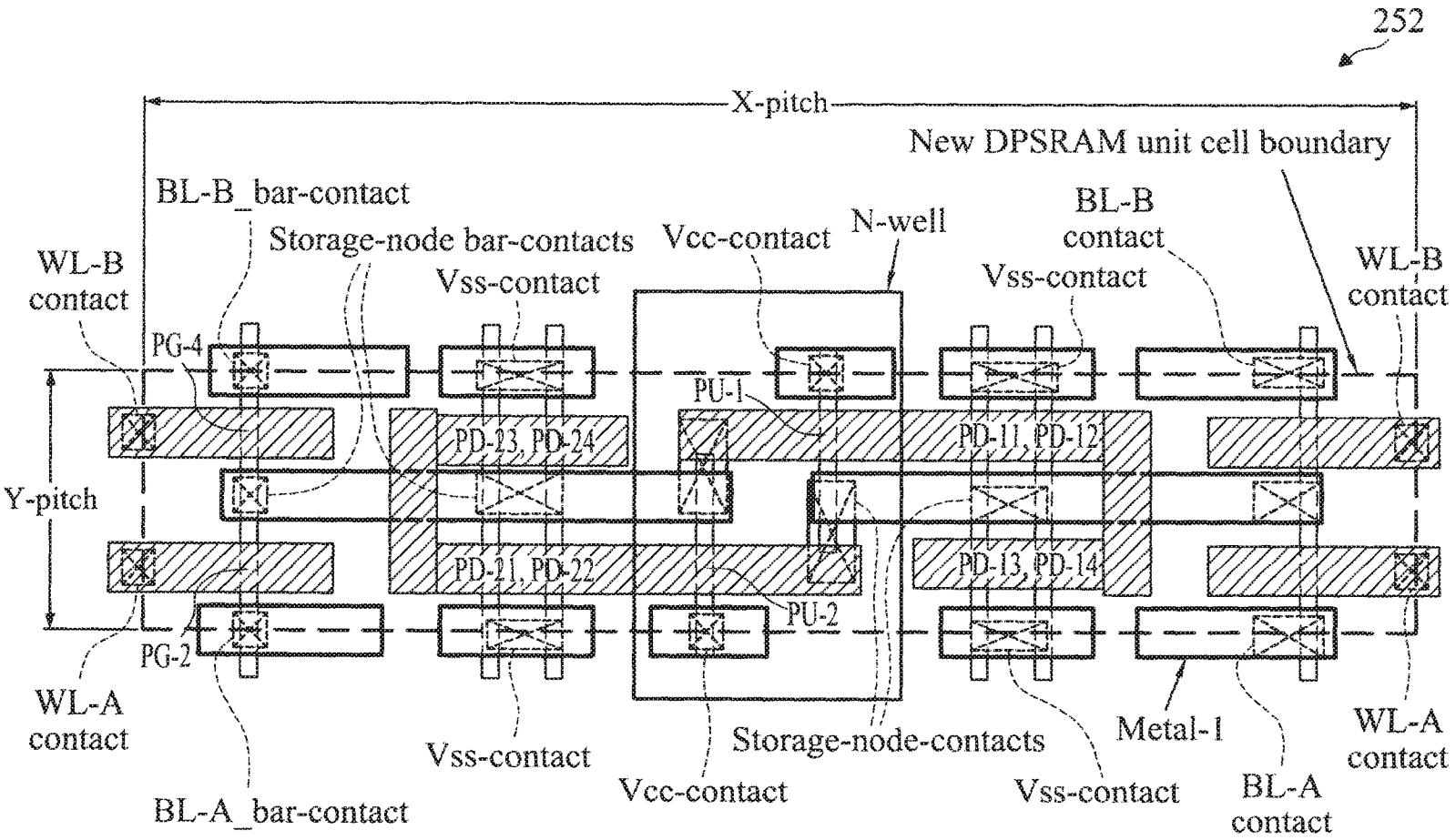

FIG. 14 is a top view of a DP SRAM device 252 in another embodiment. The DP SRAM device 252 includes 4 pull-down devices PD-11, PD-12, PD-13 and PD-14 for the first inverter. The DP SRAM device 252 also includes 4 pull-down devices PD-21, PD-22, PD-23 and PD-24 for the second inverter. The DP SRAM device 252 further includes 4 pass-gate devices PG-1, PG-2, PG-3 and PG-4 configured as shown in FIG. 14. DP SRAM device 252 further includes various contact features configured and designed for different routing functions. For example, the DP SRAM device 252 includes rectangular contact features oriented in the first direction 116 for drain connections. In another example, the DP SRAM device 252 includes rectangular contact features oriented in the second direction 118 for source and gate connections. The DP SRAM device 252 also includes various metal features (various non-shading rectangles) formed in a first metal layer as illustrated in FIG. 14. The ratio R of the DP SRAM device 252 is 2/1.

Figure 15:
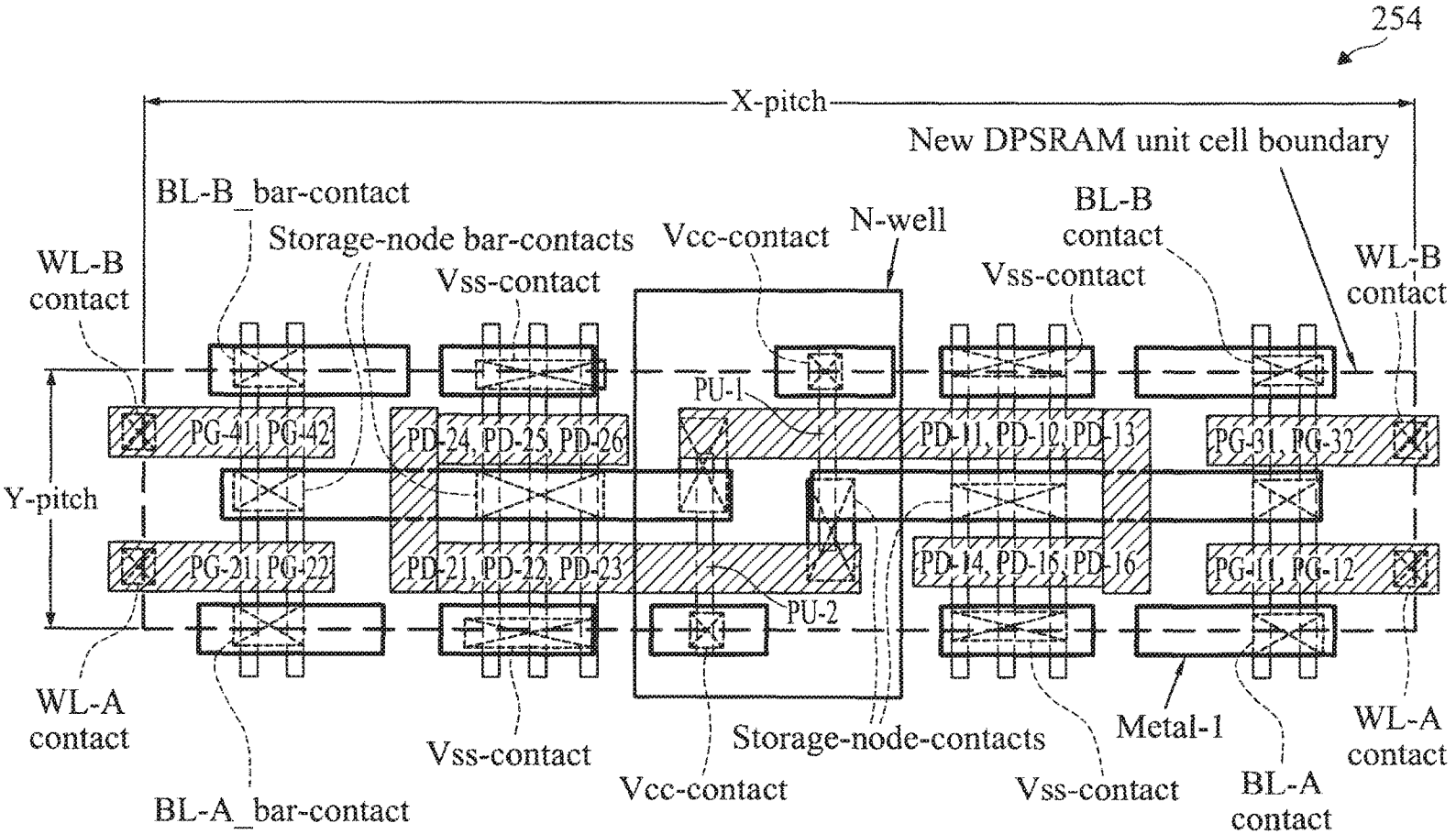

FIG. 15 is a top view of a DP SRAM device 254 in another embodiment. The DP SRAM device 254 includes 6 pull-down devices PD-11, PD-12, PD-13, PD-14, PD-15 and PD-16 for the first inverter. The DP SRAM device 254 also includes 6 pull-down devices PD-21, PD-22, PD-23, PD-24, PD-25 and PD-26 for the second inverter. The DP SRAM device 254 further includes 8 pass-gate devices PG-11, PG-12, PG-21, PG-22, PG-31, PG-32, PG-41 and PG-42 configured as shown in FIG. 15. DP SRAM device 254 further includes various contact features configured and designed for different routing functions. For example, the DP SRAM device 254 includes rectangular contact features oriented in the first direction 116 for drain connections. In another example, the DP SRAM device 254 includes rectangular contact features oriented in the second direction 118 for source and gate connections. The DP SRAM device 254 also includes various metal features (various non-shading rectangles) formed in a first metal layer as illustrated in FIG. 15. The ratio R of the DP SRAM device 254 is 3/2. The DP SRAM devices 252 of FIGS. 14 and 254 of FIG. 15 are two examples of the SRAM cell 252 with segmented gates.

Figure 16:
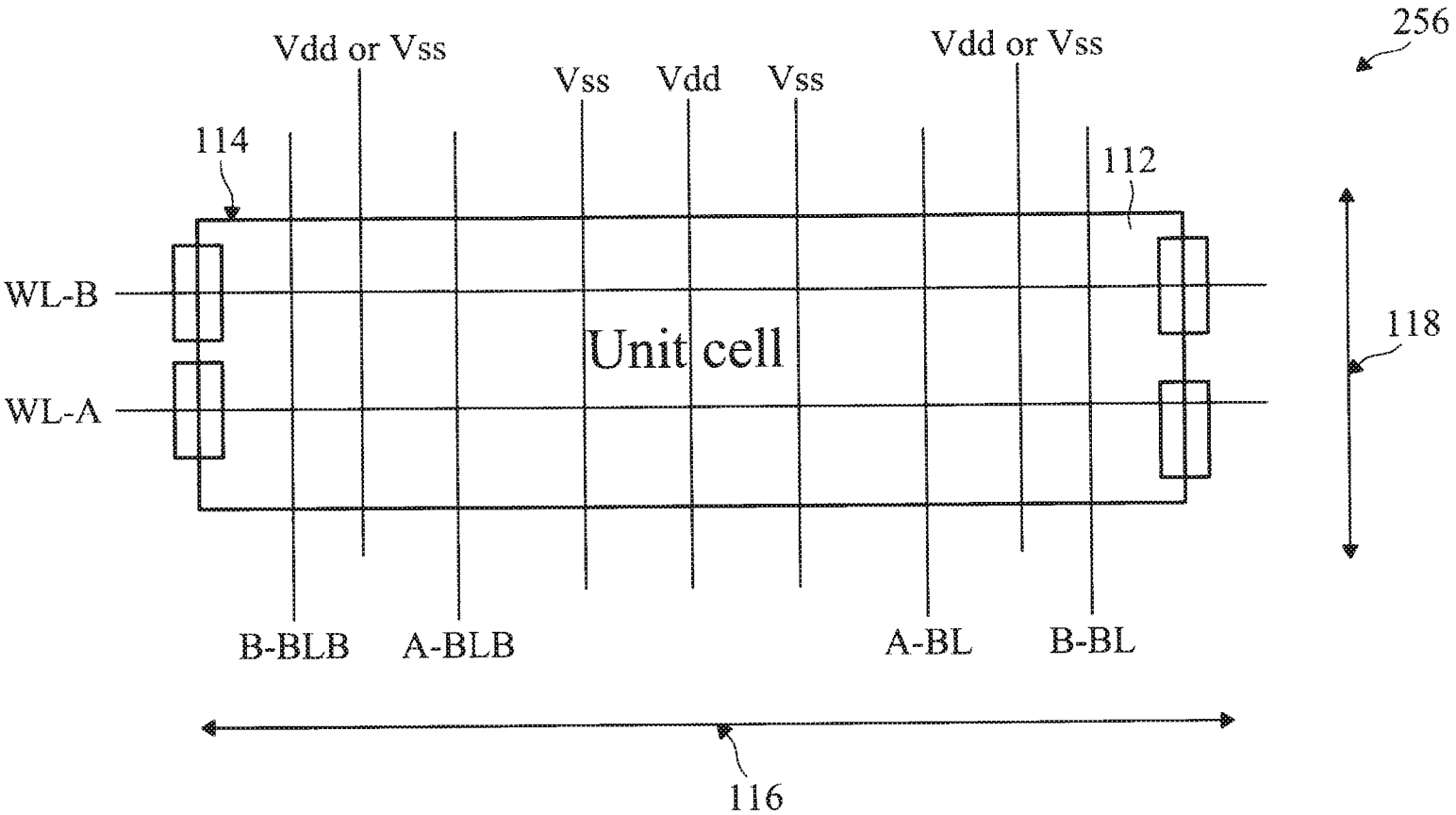

FIG. 16 is a portion of a DP SRAM cell in a top view and constructed according to various embodiments. More particularly, an interconnect structure 256 of the DP SRAM cell, such as the DP SRAM cell 252 of FIG. 14 or 254 of FIG. 15, is constructed and presented in FIG. 16. The interconnect structure 256 includes a second metal layer with various metal lines oriented in the second direction 118 and a third metal layer with various metal lines oriented in the first direction 116 configured for various routings.

Figure 17:
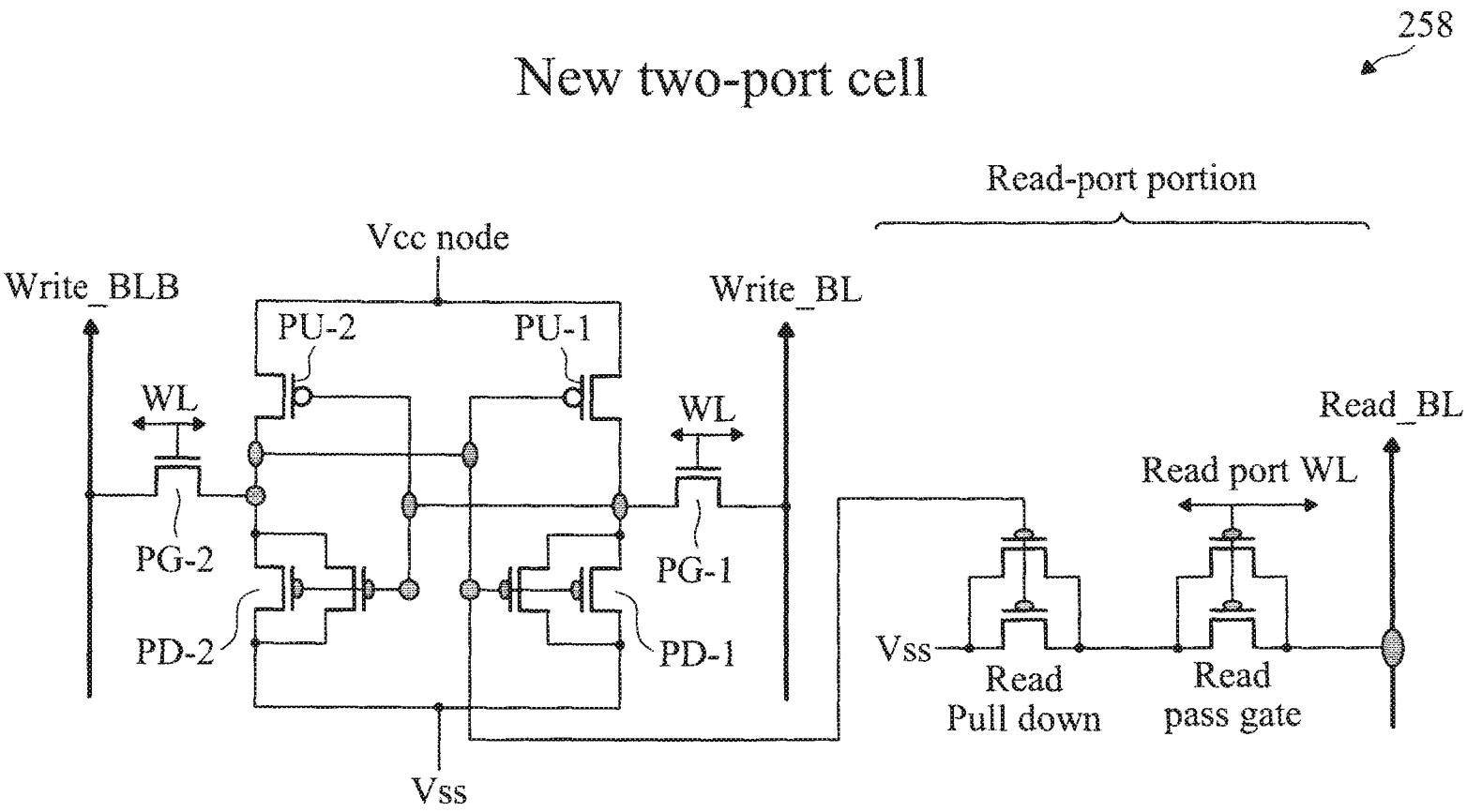
FIG. 17 is a schematic view of a DP SRAM device constructed according to various aspects of the present disclosure in yet another embodiment.

FIG. 17 is a schematic view of a dual-port (DP) SRAM cell 258 constructed according to various aspects of the present disclosure in one embodiment. The DP SRAM cell 258 includes a write port configured similar to one port of the SRAM cell 100 of FIG. 1. The DP SRAM cell 258 also includes a read port having read pull-down devices and read pass-gate devices. In one embodiment, the read port includes one or more read pull-down devices configured in parallel and one or more pass-gate devices configured in parallel. The sources of the read pull-down devices are connected power line Vss, the drains of the read pull-down devices are connected to the sources of the read pass-gate devices, and the gates of the read pull-down devices are connected to the drain node of the first inverter. The sources of the read pass-gate devices are connected the drains of the read pull-down devices, the drains of the read pass-gate devices are connected to the read bit lines (read-BL), and the gates of the read pass-gate devices are connected to the read word line (read-WL). In the present embodiment, the read port includes 2 pull-down devices and 2 pass-gate devices.

Figure 18:
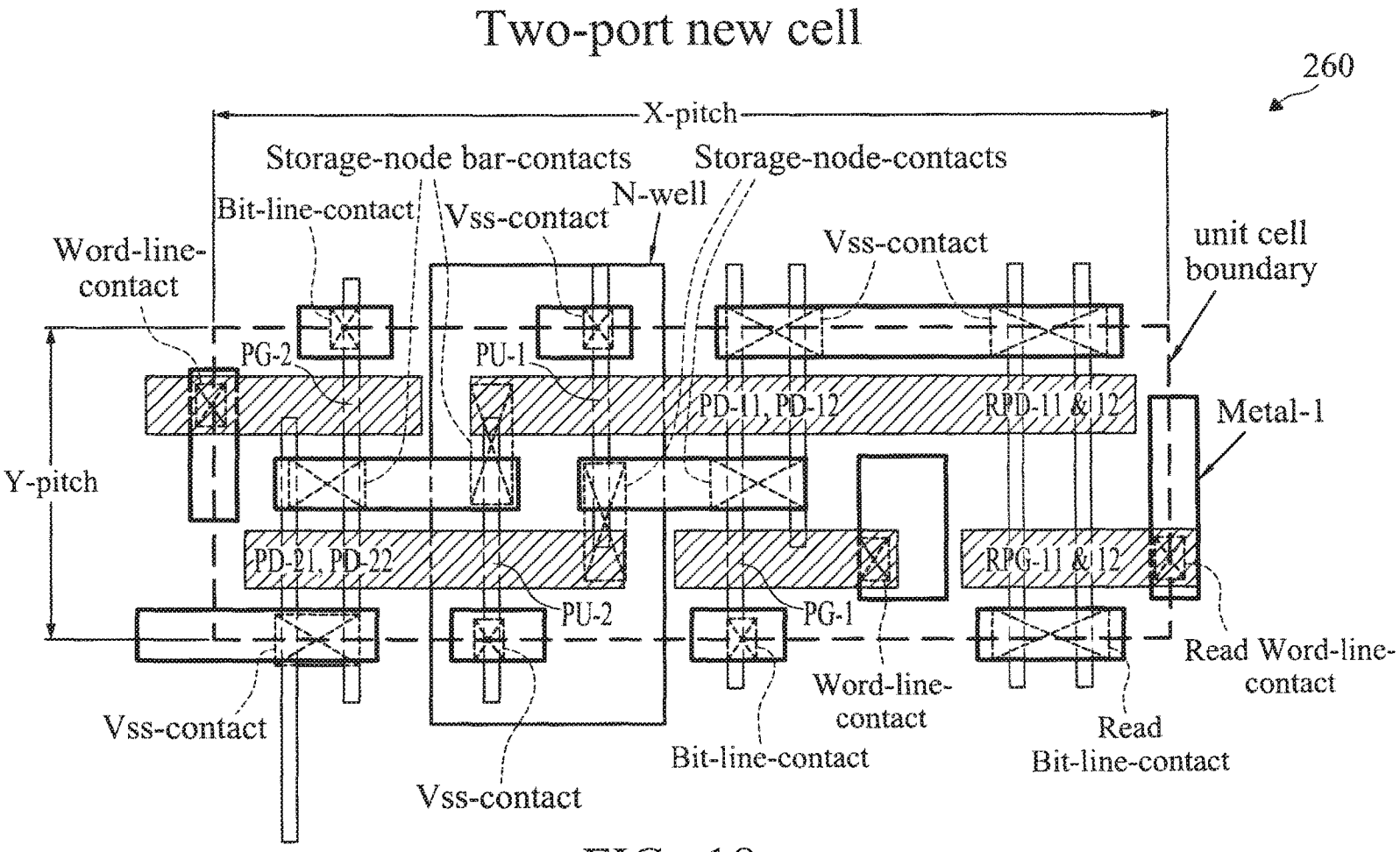

FIG. 18 is a top view of a DP SRAM device 260 in another embodiment. In one embodiment, the DP SRAM device 260 is a portion of the DP SRAM cell 258 in one layout. In FIG. 18, the read port includes 2 read pull-down devices RPD-11 and RPD-12. The read port also includes 2 read pass-gate devices RPG-11 and RPG-12. The DP SRAM device 260 also includes various contacts and metal lines (non-shading rectangles) of the first metal layer.

Figure 19:
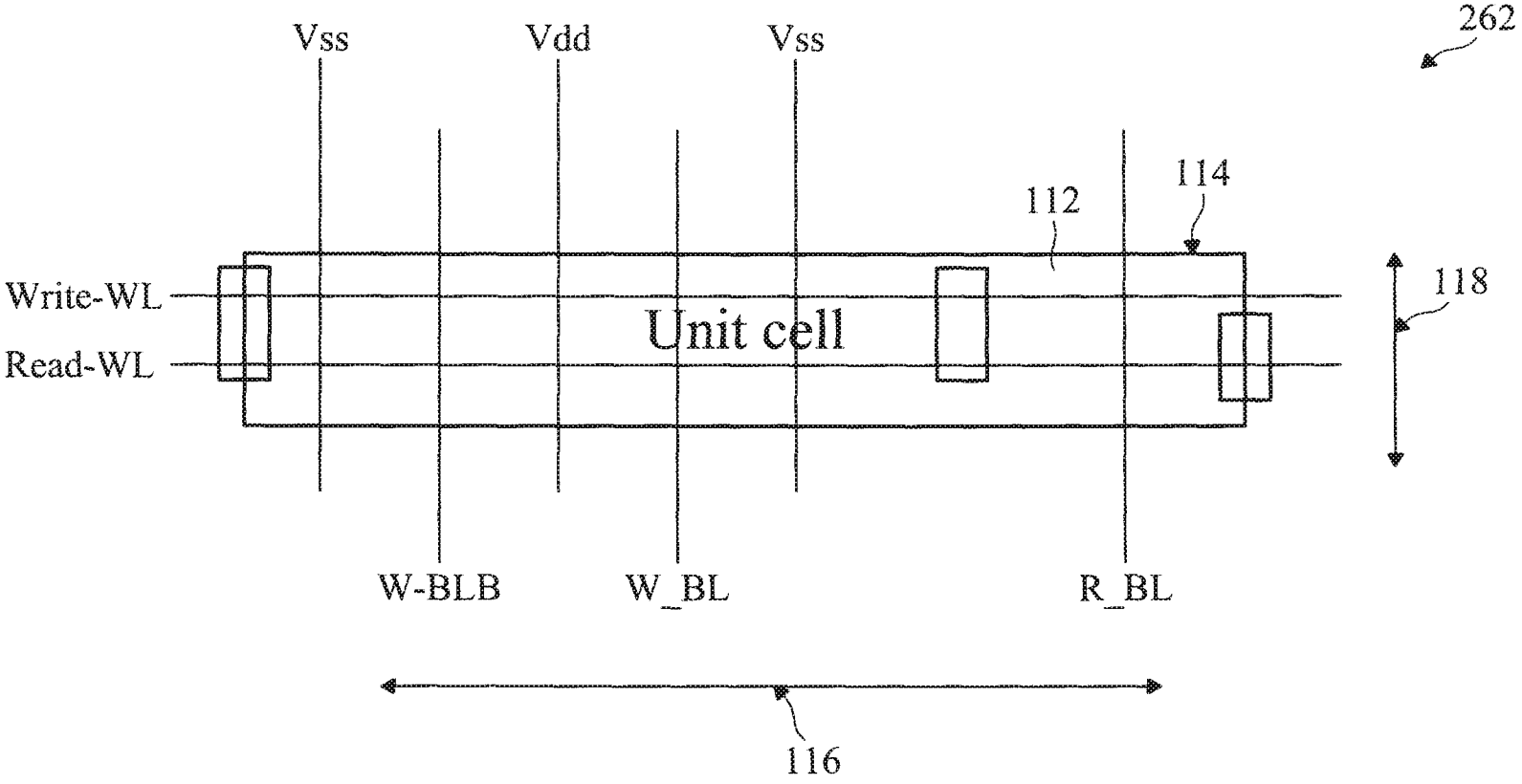

FIG. 19 is a portion of a DP SRAM cell in a top view and constructed according to various embodiments. More particularly, an interconnect structure 262 of the DP SRAM cell, such as the DP SRAM cell 260 of FIG. 18, is constructed and illustrated in FIG. 19. The interconnect structure 262 includes a second metal layer with various metal lines oriented in the second direction 118 and a third metal layer with various metal lines oriented in the first direction 116 configured for various routings. In the present embodiment, the interconnect structure 262 includes metal lines write bit-line (W-BL), write bit-line bar (W-BLB), read bit-line (R-BL), power line Vdd, and the complimentary power lines Vss. The interconnect structure 262 also includes metal lines write word-line (W-WL) and read word-line (R-WL). The interconnect structure 262 may include other metal features in the first metal layer.

In various embodiments, the disclosed DP SRAM device addresses various issues noted in the background. The present disclosure provides a dual-port SRAM cell structure and a layout with multiple pull-sown devices and multiple pass-gate devices configured such that the ratio R is greater than 1. The disclosed structure and layout are also good for high-k/metal-gate. One or more other advantages may present in various embodiments. In one example, the fin active features are straight and some are long and continuous to form two FinFETs, such as pull-down devices and/or pass-gate devices, to provide a better device tracking/matching between the pass-gate devices and pull-down devices on a wider range operation voltage (from the highest to the lowest Vdd operation). In another example, the simple shape of the active regions solves pull-down device current crowding issue as well as lithography proximity effect. In another example of lower operation voltage, the higher beta ratio is achieved and provides better static noise margin (SNM) performance for the cell stability.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

[1. A static random access memory (SRAM) cell comprising:

first and second inverters cross-coupled for data storage, each inverter including a pull-up device (PU) and a plurality of pull-down devices (PDs);

a plurality of pass gate devices (PGs) configured with the two cross-coupled inverters; and at least two ports coupled with the plurality of PGs for writing, wherein:

each of the PU, PDs, and PGs includes a fin field-effect transistor (FinFET), a ratio between a number of PDs in the first and second inverters and a number of PGs in the at least two ports is greater than 1, a number of FinFETs in the SRAM cell is equal to or greater than 12;

a first metal layer providing local interconnection to the first and second inverters, the first metal layer including:

a first Vss line and a second Vss line;

a Vdd line;

a first constant voltage line and a second constant voltage line; and a first bit line and a second bit line, wherein the first and second Vss lines, the Vdd line, the first and second constant voltage lines, and the first and second bit lines are oriented in a first direction;

a second metal layer formed over the first metal layer, the second metal layer including a first word line and a second word line oriented in a second direction that is different from the first direction, wherein the first word line is a write word line and the second word line is a read word line; and a read port for reading, wherein the read port is different than the at least two ports coupled with the plurality of PGs for writing, wherein the read port includes at least two PDs in parallel and at least two PGs in parallel.]

[2. The SRAM cell of claim 1, wherein each FinFET includes a channel having a top portion with a first width and a sidewall portion with a second width, the first width being less than the second width.]

[3. The SRAM cell of claim 1, further comprising a plurality of FinFETs formed on a plurality of fin-type active regions.]

[4. The SRAM cell of claim 1, wherein the ratio is equal to one of 3/2 and 5/4.]

[5. The SRAM cell of claim 1, further comprising at least four pass-gate devices, at least six pull-down devices, and at least two pull-up devices.]

[6. The SRAM cell of claim 5, comprising:

a first PU (PU1), a first PD (PD11), a second PD (PD12), and a third PD (PD13) configured to form the first inverter, wherein drains of PU1, PD11, PD12, and PD13 are electrically connected to form a first drain node;

a second PU (PU2), a fourth PD (PD21), a fifth PD (PD22), and a sixth PD (PD23) configured to form the second inverter, wherein drains of PU2, PD21, PD22, and PD23 are electrically connected to form a second drain node;

a first PG (PG1) and second PG (PG2) configured to form a first port, wherein:

a first drain of PG1 is electrically connected to a bit-line of the first port, a second drain of PG2 is electrically connected to a bit-line bar of the first port, a first source of PG1 is electrically connected to the first drain node, and a second source of PG2 is electrically connected to the second drain node; and a third PG (PG3) and fourth PG (PG4) configured to form a second port, wherein:

a third drain of PG3 is electrically connected to a bit-line of the second port, a fourth drain of PG4 is electrically connected to a bit-line bar of the second port, a third source of PG3 is electrically connected to the first drain node, and a fourth source of PG4 is electrically connected to the second drain node.]

[7. The SRAM cell of claim 1, wherein at least one of the first and second constant voltage lines is configured between the first and second bit lines for noise shielding, and wherein the first and second constant voltage lines are electrically connected to Vdd and Vss.]

[8. A static random access memory (SRAM) cell comprising:

a first set of fin field-effect transistors (FinFETs) having two pull-up devices (PUs) and a first number of pull-down devices (PDs) configured to form first and second cross-coupled inverters;

a second set of FinFETs having a second number of pass-gate devices (PGs) configured to form at least two ports, wherein the first number is greater than the second number;

word lines connected to gates of the PGs, respectively;

bit lines connected to drains of the PGs, respectively, two Vss lines and a Vdd line, wherein the two Vss lines, the Vdd line, and the bit lines are formed in a first metal layer and oriented in a first direction, and the word lines are formed in a second metal layer over the first metal layer and oriented in a second direction different from the first direction, the word lines comprise a write word line and a read word line; and a read port that is different than the at least two ports, wherein the read port includes at least two PDs in parallel and at least two PGs in parallel.]

[9. The SRAM cell of claim 8, wherein the first set and second set of FinFETs include at least 12 FinFETs.]

[10. The SRAM cell of claim 8, wherein a ratio between the first number and the second number is equal to one of 3:2, 2:1, or 5:4.]

[11. The SRAM cell of claim 8, wherein the first and second sets of FinFETs are formed on a plurality of fin active regions.]

[12. The SRAM cell of claim 8, wherein the first inverter includes a first subset of the PDs, wherein drains of the first set of the PDs are electrically connected together through one of silicide, long contact line, and combinations thereof; and the second inverter includes a second subset of the PDs, wherein drains of the second set of the PDs are electrically connected together through one of silicide, long contact line, and combination thereof.]

[13. The SRAM cell of claim 8, wherein a ratio between a first length of the word lines and a second length of the bit lines is greater than about 3.5:1.]

[14. The SRAM cell of claim 8, wherein at least one of the Vdd line and the Vss lines is configured between two bit-lines for noise shielding.]

[15. The SRAM cell of claim 8, further comprising at least four Vss lines.]

[16. A dual port static random access memory (SRAM) cell comprising:

a first inverter having a first pull-up transistor (PU1) and a first group of pull-down transistors (PDs);

a second inverter having a second pull-up transistor (PU2) and a second group of PDs, the second inverter being cross-coupled with the first inverter;

a first group of pass-gate transistors (PGs) coupled with the first and second inverters to form a first port; and a second group of PGs coupled with the first and second inverters to form a second port;

wherein each of the PDs and PGs includes an n-type fin field-effect transistor (nFinFET) and each of the pull-up transistors includes a p-type fin field-effect transistor (pFinFET), and wherein there are more PDs than PGs in the SRAM cell;

a first metal layer providing local interconnection to the first and second inverters, the first metal layer including:

a first Vss line and a second Vss line;

a Vdd line positioned between the first and second Vss lines;

a first constant voltage line and a second constant voltage line; and a first bit line and a second bit line, wherein the first and second Vss lines, the Vdd line, the first and second constant voltage lines, and the first and second bit lines are oriented in a first direction;

a second metal layer formed over the first metal layer, the second metal layer including a first word line and a second word line oriented in a second direction that is different from the first direction, wherein the first word line is a write word line and the second word line is a read word line; and a read port that is different than the first and second ports, wherein the read port includes at least two PDs in parallel and at least two PGs in parallel.]

[17. The SRAM cell of claim 16, wherein the first group of PDs includes 5 nFinFETs, wherein drains of the first group of PDs are connected through one of silicide and long contact line;

the second group of PDs includes 5 nFinFETs, wherein drains of the second group of PDs are connected through one of silicide and long contact line;

the first group of PGs includes 4 nFinFETs; and the second group of PGs includes 4 nFinFETs.]

[18. The SRAM cell of claim 16, wherein the first group of PDs includes PD11, PD12, and PD13;

the second group of PDs includes PD21, PD22, and PD23;

the first group of PGs includes PG1 and PG2;

the second group of PGs includes PG3 and PG4; and wherein the PD12 and PG1 are formed in a first continuous fin active region, and the PD22 and PG4 are formed in a second continuous fin active region.]

[19. The SRAM cell of claim 16, wherein:

the first group of PDs includes 6 nFinFETs formed on first four long fin active regions and first two short fin active regions;

the second group of PDs includes 6 nFinFETs formed on second four long fin active regions and second two short fin active regions;

the first group of PGs includes 4 nFinFETs;

the second group of PGs includes 4 nFinFETs; and wherein each of the first and second groups of PGs is formed on one of the first and second four long fin active regions.]

[20. The SRAM cell of claim 16, wherein:

the first group of PDs includes 4 nFinFETs formed on two fin active regions;

the second group of PDs includes 4 nFinFETs formed on another two fin active regions;

the first group of PGs includes PG1 and PG2;

the second group of PGs includes PG3 and PG4; and wherein the PG1 and PG3 are formed in a first continuous fin active region, and the PG2 and PG4 are formed in a second continuous fin active region.]

*21. A static random access memory (SRAM) cell including a plurality of pass gate fin field-effect transistor (FINFET), a plurality of pull-down FINFET, and a plurality of pull-up FINFET, the SRAM cell comprising:*

*a first fin and a second fin on a semiconductor substrate in a first well region, wherein each of the first and second fins includes source, channel, and drain regions of one of the pull-up FINFETs;*

*a third fin and a fourth fin on the semiconductor substrate in a second well region, wherein each of the third and fourth fins includes source, channel, and drain regions of one of the pull-down FINFETs and one of the third and fourth fins further includes source, channel, and drain regions of one of the pass gate FINFETs, wherein the third and fourth fins are spaced apart from a first side of the first and second fins;*

*a fifth fin and a sixth fin on the semiconductor substrate in the second well region, wherein each of the fifth and sixth fins includes source, channel, and drain regions of one of the pull-down FINFETs and one of the fifth and sixth fins further includes source, channel, and drain regions of one of the pass gate FINFETs, wherein the fifth and sixth fins are spaced apart from a second side opposite to the first side of the first and second fins;*

*wherein the first, second, third, fourth, fifth, and sixth fins extend in a first direction;*

*a first gate layer formed on at least one of the first and second fins and at least one of the third and fourth fins, wherein the first gate layer includes gate regions of at least one of the pull-down FINFETs and at least one of pull-up FINFETs;*

*a second gate layer formed on at least one the first and second fins and at least one of the fifth and sixth fins, wherein the second gate layer includes gate regions of at least one of the pull-down FINFETs and at least one of pull-up FINFETs;*

*a third gate layer formed on at least one of the third and fourth fins, wherein the third gate layer includes gate regions of at least one of the pass gate FINFETs;*

*a fourth gate layer formed on at least one of the fifth and sixth fins, wherein the fourth gate layer includes gate regions of at least one of the pass gate FINFETs;*

*wherein the first, second, third and fourth gate layers extend in a second direction perpendicular to the first direction;*

*a first contact feature formed on the third and fourth fins between the first and third gate layers, wherein the first contact feature extends in the second direction;*

*a second contact feature formed on the first fin for connecting the first contact feature with the second gate layer, wherein the second contact feature extends in the first direction;*

*a third contact feature formed on the fifth and sixth fins between the second and fourth gate layers, wherein the third contact feature extends in the second direction;*

*a fourth contact feature formed on the second fin for connecting the third contact feature with the first gate layer, wherein the fourth contact feature extends in the first direction; and*

*a read port that includes at least two pull-down FINFETs in parallel and at least two pass gate FINFETs in parallel.*

*22. The SRAM cell of claim 21, wherein the first well region is one of a n-well region and a p-well region and the second well region is another one of the n-well region and the p-well region.*

*23. The SRAM cell of claim 21, wherein the first gate layer is formed on the first fin and the second gate layer is formed on the second fin.*

*24. The SRAM cell of claim 21, wherein, along the second direction, each of the contact features has a dimension greater than a dimension of the fin where the respective contact feature is formed on.*

*25. The SRAM cell of claim 21, further comprising:*

*a fifth contact feature on the first fin for connecting to a first power line;*

*a sixth contact feature on the second fin for connecting to the first power line;*

*a seventh contact feature on the third and fourth fins for connecting to a second power line; and*

*an eighth contact feature on the fifth and sixth fins for connecting to the second power line.*

*26. The SRAM cell of claim 25, wherein the first power line connects to one of VCC and VSS and the second power line connects to another one of VCC and VSS.*

*27. The SRAM cell of claim 25, further comprising:*

*a ninth contact feature on at least one of the third and fourth fins for connecting to a first bit line; and*

*a tenth contact feature on at least one of the fifth and sixth fins for connecting to a second bit line.*

*28. The SRAM cell of claim 27, further comprising:*

*an eleventh contact feature on the third gate layer for connecting to a first word line; and*

*a twelfth contact feature on the fourth gate layer for connecting to a second word line.*

*29. The SRAM cell of claim 28, further comprising:*

*a seventh fin on the semiconductor substrate in the second well region, wherein the seventh fin includes source, channel, and drain regions of one of the pass gate FINFETs and wherein the third gate layer is formed on the seventh fin; and*

*an eighth fin on the semiconductor substrate in the second well region, wherein the eighth fin includes source, channel, and drain regions of one of the pass gate FINFETs and wherein the fourth gate layer is formed on the eighth fin,*

*wherein the seventh and eighth fins extend in the first direction.*

*30. The SRAM cell of claim 29, further comprising:*

*a thirteenth contact feature on the seventh fin for connecting to the first gate layer;*

*a fourteenth contact feature on the eighth fin for connecting to the second gate layer;*

*a fifteenth contact feature on the seventh fin for connecting to a third bit line; and*

*a sixteenth contact feature on the eighth fin for connecting to a fourth bit line.*

*31. The SRAM cell of claim 30, wherein the first and third bit lines are complementary bit lines and the second and fourth bit lines are complementary bit lines.*

*32. The SRAM cell of claim 21, further comprising:*

*a first common region on at least one of the third and fourth fins defined by the source and drain regions of one of the pull down FINFETs and one of the pass gate FINFETs connected in series therethrough; and*

*a second common region on at least one of the fifth and sixth fins defined by the source and drain regions of one of the pull down FINFETs and one of the pass gate FINFETs connected in series therethrough.*

*33. The SRAM cell of claim 32, wherein the first contact feature is formed on the first common region and the second contact feature is formed on the second common region.*

*34. A static random access memory (SRAM) cell including a plurality of pass gate fin field-effect transistors (FINFETs), a plurality of pull-down FINFETs, and a plurality of pull-up FINFETs, the SRAM cell comprising:*

*a first fin on a semiconductor substrate in an n-well region;*

*second, third, fourth, and fifth fins on the semiconductor substrate in a p-well region and on one side of the first fin;*

*a sixth fin on the semiconductor substrate in the n-well region and on another side of the first fin;*

*seventh, eighth, ninth, and tenth fins on the semiconductor substrate in another p-well region, wherein the first fin and the seventh through tenth fins are on opposite sides of the sixth fin, wherein the first through tenth fins are distributed along a first direction and oriented along a second direction that is perpendicular to the first direction;*

*wherein the first fin includes source, channel, and drain regions of a first pull-up FINFET;*

*wherein the second, third, and fourth fins include source, channel, and drain regions of first, second, third pull-down FINFETs respectively;*

*wherein the third fin further includes source, channel, and drain regions of a first pass gate FINFET, wherein the drain region of the second pull-down device and the source region of the first pass gate device share a first common region in the third fin;*

*wherein the fifth fin includes source, channel, and drain regions of a second pass gate FINFET;*

*wherein the sixth fin includes source, channel, and drain regions of a second pull-up FINFET;*

*wherein the seventh, eighth, and ninth fins include source, channel, and drain regions of fourth, fifth, and sixth pull-down FINFETs respectively, and the eighth fin further includes source, channel, and drain regions of a third pass gate FINFET, wherein the drain region of the fifth pull-down FINFET and the source region of the third pass gate FINFET share a second common region in the eighth fin;*

*wherein the tenth fin includes source, channel, and drain regions of a fourth pass gate FINFET;*

*a first contact feature that electrically connects to at least the first common region and the drain region of the first pull-up FINFET;*

*a second contact feature that electrically connects to at least the second common region and the drain region of the second pull-up FINFET; and*

*a read port that includes at least two pull-down FINFETs in parallel and at least two pass gate FINFETs in parallel.*

35. The SRAM cell of claim 34, further comprising:

a first gate electrode oriented in the first direction and over the channel regions of the first pull-up FINFET and the first, second, and third pull-down FINFETs;

a second gate electrode oriented in the first direction and over the channel regions of the second pull-up FINFET and the fourth, fifth, and sixth pull-down FINFETs;

a third gate electrode oriented in the first direction and over the channel regions of the first and second pass gate FINFETs; and a fourth gate electrode oriented in the first direction and over the channel regions of the third and fourth pass gate FINFETs.

36. The SRAM cell of claim 35, further comprising:

a third contact feature that electrically connects the source region of the first pull-up FINFET to a first power line;

a fourth contact feature that electrically connects the source regions of the first, second, and third pull-down FINFETs to a second power line;

a fifth contact feature that electrically connects the drain region of the first pass gate FINFET to a first bit line;

a sixth contact feature that electrically connects the drain region of the second pass gate FINFET to a second bit line;

a seventh contact feature that electrically connects the third gate electrode to a first word line;

a eighth contact feature that electrically connects the source region of the second pull-up FINFET to the first power line;

a ninth contact feature that electrically connects the source regions of the fourth, fifth, and sixth pull-down FINFETs to the second power line;

a tenth contact feature that electrically connects the drain region of the third pass gate FINFET to a third bit line;

a eleventh contact feature that electrically connects the drain region of the fourth pass gate FINFET to a fourth bit line; and a twelfth contact feature that electrically connects the fourth gate electrode to a second word line.

37. The SRAM cell of claim 35, further comprising:

a third contact feature that electrically connects to the first contact feature and the second gate electrode, wherein the first and third contact features form an L-shape.

38. The SRAM cell of claim 37, wherein the first and third contact features and the second gate electrode are in a same interconnect level of the SRAM cell.

39. The SRAM cell of claim 37, further comprising:

a fourth contact feature that electrically connects to the second contact feature and the first gate electrode, wherein the second and fourth contact features form an L-shape.

40. The SRAM cell of claim 39, wherein the second and fourth contact features and the first gate electrode are in a same interconnect level of the SRAM cell.

41. The SRAM cell of claim 35, further comprising:

a first conductive feature that electrically connects to the source region of the second pass gate FINFET and the first gate electrode; and a second conductive feature that electrically connects to the source region of the fourth pass gate FINFET and the second gate electrode.

42. The SRAM cell of claim 41, wherein the first and second conductive features and the first and second gate electrode are in a same interconnect level of the SRAM cell.

43. The SRAM cell of claim 35, wherein the first gate electrode lands on the source region of the second pass gate FINFET, and the second gate electrode lands on the source region of the fourth pass gate FINFET.

44. A dual port static random access memory (SRAM) cell including a plurality of pass gate fin field-effect transistor (FINFETs), a plurality of pull-down FINFETs, and a plurality of pull-up FINFETs, the SRAM cell comprising:

a first fin on a semiconductor substrate in an n-well region;

second, third, fourth, and fifth fins on the semiconductor substrate in a p-well region on one side of the n-well region;

a sixth fin on the semiconductor substrate in the n-well region;

seventh, eighth, ninth, and tenth fins on the semiconductor substrate in another p-well region on another side of the n-well region, wherein the first through tenth fins are distributed along a first direction and oriented along a second direction that is perpendicular to the first direction;

wherein the first and sixth fins include source, channel, and drain regions of first and second pull-up FINFETs;

wherein the second, third, and fourth fins include source, channel, and drain regions of first, second, and third pull-down FINFETs respectively;

wherein the third fin further includes source, channel, and drain regions of a first pass gate FINFET, wherein the drain region of the second pull-down FINFET and the source region of the first pass gate FINFET share a first common region in the third fin;

wherein the fifth fin includes source, channel, and drain regions of a second pass gate FINFETs;

wherein the seventh, eighth, and ninth fins include source, channel, and drain regions of fourth, fifth, and sixth pull-down FINFETs respectively, and the eighth fin further includes source, channel, and drain regions of a third pass gate FINFET, wherein the drain region of the fifth pull-down FINFET and the source region of the third pass gate FINFET share a second common region in the eighth fin;

wherein the tenth fin includes source, channel, and drain regions of a fourth pass gate FINFET;

a first gate electrode oriented in the first direction and over the channel regions of the first pull-up FINFET and the first, second, and third pull-down FINFETs;

a second gate electrode oriented in the first direction and over the channel regions of the second pull-up FINFET, and the fourth, fifth, and sixth pull-down FINFETs;

a first contact feature that electrically connects to at least the drain region of the first pull-up FINFET, the drain regions of the first, second, and third pull-down FINFETs, the source region of the first pass gate FINFET, and the second gate electrode; and a second contact feature that electrically connects to at least the drain region of the second pull-up FINFET, the drain regions of the fourth, fifth, and sixth pull-down FINFETs, the source region of the third pass gate FINFET, and the first gate electrode; and a read port that includes at least two pull-down FINFETs in parallel and at least two pass gate FINFETs in parallel.

45. The SRAM cell of claim 44, further comprising:

a third gate electrode oriented in the first direction and over the channel regions of the first and second pass gate FINFETs; and

*a fourth gate electrode oriented in the first direction and over the channel regions of the third and fourth pass gate FINFETs.*

*46. The SRAM cell of claim 45, further comprising:*

*a third contact feature that electrically connects the source region of the first pull-up FINFET to a first power line;*

*a fourth contact feature that electrically connects the source regions of the first, second, and third pull-down FINFETs to a second power line;*

*a fifth contact feature that electrically connects the drain region of the first pass gate FINFET to a first bit line;*

*a sixth contact feature that electrically connects the drain region of the second pass gate FINFET to a second bit line;*

*a seventh contact feature that electrically connects the third gate electrode to a first word line;*

*a eighth contact feature that electrically connects the source region of the second pull-up FINFET to the first power line;*

*a ninth contact feature that electrically connects the source regions of the fourth, fifth, and sixth pull-down FINFETs to the second power line;*

*a tenth contact feature that electrically connects the drain region of the third pass gate FINFET to a third bit line;*

*a eleventh contact feature that electrically connects the drain region of the fourth pass gate FINFET to a fourth bit line; and*

*a twelfth contact feature that electrically connects the fourth gate electrode to a second word line.*

*47. The SRAM cell of claim 44, wherein the first and second contact features and the first and second gate electrodes are in a same interconnect level of the SRAM cell.*

*48. The SRAM cell of claim 44, wherein each of the first and second contact features has a general L-shape with a first portion of the L-shape oriented generally in the first direction and a second portion of the L-shape oriented generally in the second direction.*

*49. The SRAM cell of claim 44, further comprising:*

*a first conductive feature that electrically connects to the source region of the second pass gate FINFET and the first gate electrode; and*

*a second conductive feature that electrically connects to the source region of the fourth pass gate FINFET and the second gate electrode, wherein the first and second conductive features and the first and second gate electrodes are in a same interconnect level of the SRAM cell.*

*50. The SRAM cell of claim 44, wherein the first gate electrode lands on the source region of the second pass gate FINFET, and the second gate electrode lands on the source region of the fourth pass gate FINFET.*

* * * * *